(12) United States Patent
Otsuka et al.

(10) Patent No.: US 8,384,212 B2
(45) Date of Patent: Feb. 26, 2013

(54) SEMICONDUCTOR EQUIPMENT AND METHOD OF MANUFACTURING THE SAME

(75) Inventors: Nobuyuki Otsuka, Kyoto (JP); Manabu Yanagihara, Osaka (JP); Shuichi Nagai, Osaka (JP); Daisuke Ueda, Kyoto (JP)

(73) Assignee: Panasonic Corporation, Osaka (JP)

( * ) Notice: Subject to any disclaimer, the term of this patent is extended or adjusted under 35 U.S.C. 154(b) by 25 days.

(21) Appl. No.: 13/173,647

(22) Filed: Jun. 30, 2011

(65) Prior Publication Data

US 2011/0254147 A1    Oct. 20, 2011

Related U.S. Application Data

(63) Continuation of application No. PCT/JP2010/005515, filed on Sep. 9, 2010.

(30) Foreign Application Priority Data

Mar. 10, 2010  (JP) .................................. 2010-053874

(51) Int. Cl.
    *H01L 23/10*    (2006.01)
(52) U.S. Cl. ........ 257/710; 257/711; 257/713; 257/714; 257/715; 257/720; 257/721
(58) Field of Classification Search ........................ None
See application file for complete search history.

(56) References Cited

U.S. PATENT DOCUMENTS

| 5,383,341 | A  | * | 1/1995  | Zur et al. ........................ 62/476 |
| 7,035,301 | B2 | * | 4/2006  | Chikugawa ..................... 372/36 |
| 7,422,698 | B2 | * | 9/2008  | Minor ............................. 252/68 |
| 2005/0285079 | A1 | * | 12/2005 | Minor ............................. 252/67 |
| 2006/0090881 | A1 |   | 5/2006  | Tuma |
| 2007/0068656 | A1 |   | 3/2007  | Lee et al. |
| 2007/0131896 | A1 | * | 6/2007  | Minor ............................. 252/67 |
| 2009/0020267 | A1 |   | 1/2009  | Fukushima |

FOREIGN PATENT DOCUMENTS

| JP | 47-41169     | 12/1972 |
| JP | 62-97357     | 5/1987  |
| JP | 63-122250    | 5/1988  |
| JP | 7-161888     | 6/1995  |
| JP | 2583343      | 2/1997  |
| JP | 9-107050     | 4/1997  |
| JP | 11-87586     | 3/1999  |
| JP | 2007-507685  | 3/2007  |
| JP | 2008-518468  | 5/2008  |
| JP | 2009-206369  | 9/2009  |
| WO | 2007/114497  | 10/2007 |

OTHER PUBLICATIONS

K.S. Sekhon, "*Heat Pipe Applications to Control Electronics Temperature in Radars*", IEEE Mechanical Engineering in Radar, 1977, pp. 114-119.

* cited by examiner

*Primary Examiner* — David E Graybill
(74) *Attorney, Agent, or Firm* — Wenderoth, Lind & Ponack, LLP

(57) ABSTRACT

To provide a semiconductor equipment having high heat-transfer effect and breakdown voltage, and a method of manufacturing the same. The semiconductor equipment includes: a sealed container; a stem connected to the sealed container via a stem peripheral portion; and a semiconductor chip mounted on a top surface of the stem, inside the sealed container. The semiconductor chip is electrically connected to a lead provided to the stem, the stem peripheral portion, which is of a material that is different from the material of stem and the same as the material of the sealed container, is bonded along a periphery of the stem, and the sealed container is filled with a working fluid including at least one of ethanol, a perfluorocarbon, and a fluoroether.

19 Claims, 24 Drawing Sheets

Fig. 8A

| | Preservation at 20°C | Stirred at 40°C | Phase-separation temperature |
|---|---|---|---|
| Perfluorooctane (C8F18) | 0.1% | 10% | 60°C |
| Perfluorobutyl tetrahydrofuran (C8F16O) | 0.1% | 30% | 60°C |
| Ethoxynonafluorobutane (C4F9OC2H5) | 0% | <5% | 60°C |
| Dodecafluorooctanol (C3HF6-CH(CH3)O-C3HF6) | 0% | <1% | Does not dissolve |

Fig. 8B

| Stirred at 40°C | 5% | 10% | 20% | 30% | 40% |
|---|---|---|---|---|---|
| Perfluorooctane | Dissolve | Dissolve | Undissolved portion created | — | — |
| Perfluorobutyl tetrahydrofuran | Dissolve | Dissolve | Dissolve | Dissolve | Undissolved portion created |
| Ethoxynonafluorobutane | Dissolve | Undissolved portion created | — | — | — |
| Dodecafluorooctanol | Unable to verify solubility | — | — | — | — |

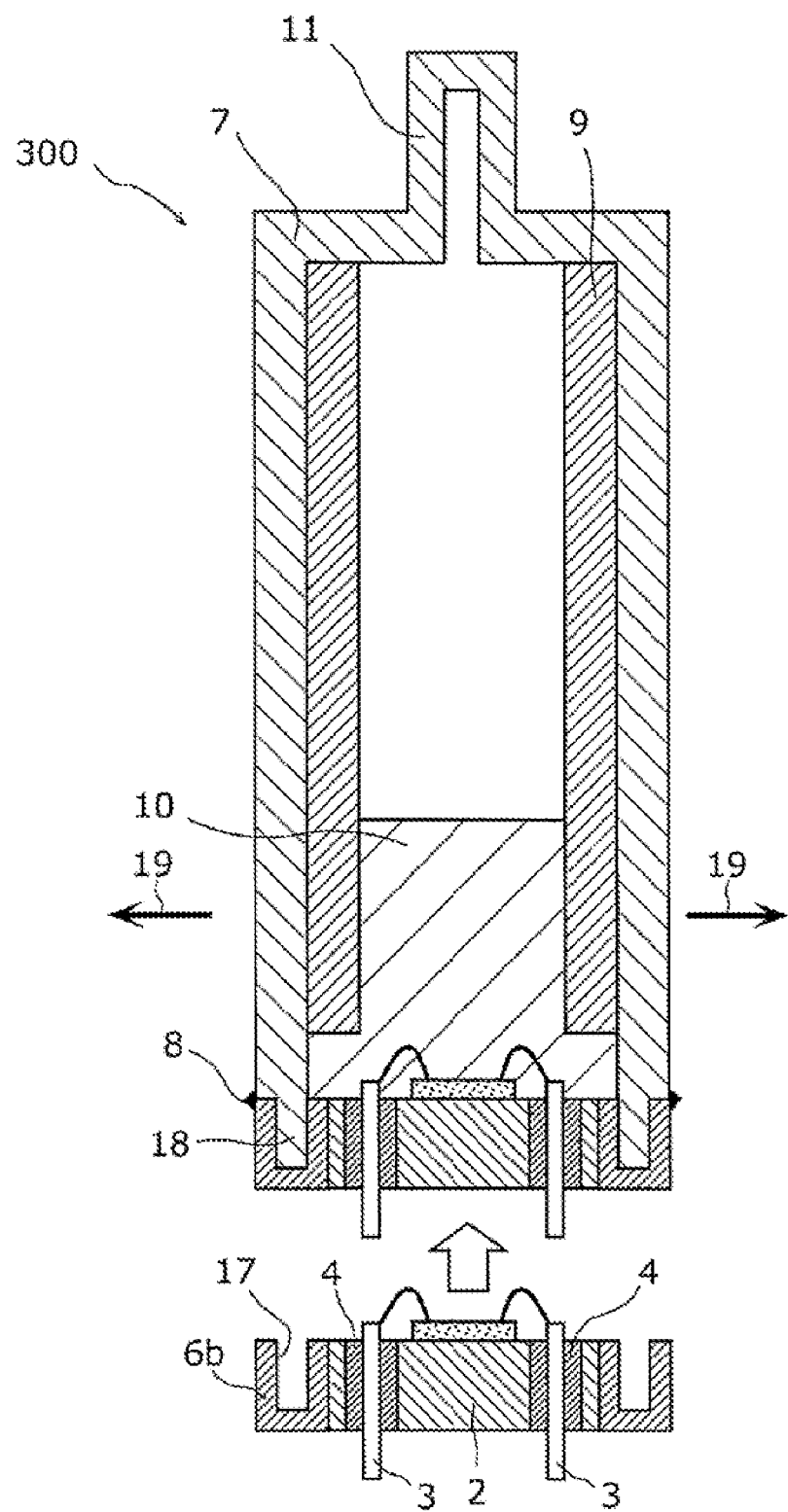

SEMICONDUCTOR EQUIPMENT AND METHOD OF MANUFACTURING THE SAME

CROSS REFERENCE TO RELATED APPLICATION

This is a continuation application of PCT application No. PCT/JP2010/005515 filed on Sep. 9, 2010, designating the United States of America.

BACKGROUND OF THE INVENTION (1) Field of the Invention

The present invention relates to a semiconductor equipment which includes a semiconductor chip inside a heat pipe, and to a method of manufacturing the semiconductor equipment.

(2) Description of the Related Art

As a material for semiconductor devices, recent years have seen active research and development being carried out on wide bandgap semiconductors such as nitride semiconductors, represented by gallium nitride (GaN), and silicon carbide (SiC).

Wide bandgap semiconductors are characterized in that dielectric breakdown voltage is one digit higher compared to that of Si, and that the on-resistance of a semiconductor device decreases. In particular, since a nitride semiconductor material such as gallium nitride (GaN), together with aluminum nitride (AlN), indium nitride (InN), and so on, allows the production of various mixed crystals, and the creation of a heterojunction which generates a two-dimensional electron gas, it is possible to realize a large-current, low-on-resistance device for high-power use even in a horizontal device where, inside a substrate, current flows in a direction parallel to the main surface of the substrate.

For example, an on-resistance value of 2 m$\Omega$cm$^2$ is obtained with a forward breakdown voltage of 600 V, and a high-power GaNFET having a very low on-resistance which is ⅒ or less than that of a conventional high-power MOSFET is realized. On the other hand, when a high-power GaNFET having the same on-resistance with the same forward breakdown voltage as a high-power MOSFET is realized, the chip surface area becomes approximately ⅒ that of the MOSFET, and thus it is possible to realize significant miniaturization of the device for high-power use. However, since heat generation density in this case becomes 10 times that of the MOSFET, the heat-transfer technique for the semiconductor chip becomes very important for a small device made of a nitride semiconductor.

Meanwhile, heat pipes are available as devices which cool by moving a large amount of heat at high speeds. A heat pipe is a metal pipe that is laid out inside a personal computer in order to disperse/eliminate heat generated from a semiconductor and so on. The heat pipe is used in thin laptop computers. Heat is released by placing a coolant in the metal pipe and utilizing the latent heat in the evaporation and condensation of liquid. Gradually transferring heat from a heat source and dispersing the heat allows for a large amount of heat transfer using a small temperature difference.

The heat pipe is structured such that a volatile liquid (working fluid) is enclosed inside a pipe made of a material having high thermal conductivity. The operating principle is as described below. By heating one end of the pipe and cooling the other end, the absorption of latent heat by the vaporization of the working fluid occurs at the hot side, and the release of latent heat through the condensation of the working fluid occurs at the cool side. The working fluid that has liquefied returns to the region where there is little working fluid, through the capillary force of a wick formed inside the pipe. Heat migrates from the high-temperature portion to the low-temperature portion through this cycle, and a high heat-transfer effect can be obtained with an appropriately designed heat pipe compared to a metal radiator (heat sink). Although setting the cold portion at a higher position than the hot portion allows the condensed working fluid to return to the hot portion through gravity, adopting a capillary structure within the pipe allows usage even when there is no difference in elevation. Classification into thermosiphons and heat pipes is based on the presence of a capillary structure (see, for example, Patent Reference 1 (Japanese Patent No. 2583343), Patent Reference 2 (Japanese Unexamined Patent Application Publication No. 11-87586), Patent Reference 3 (Japanese Unexamined Patent Application Publication No. 2009-206369), and Patent Reference 4 (Japanese Unexamined Patent Application Publication (Translation of PCT Application) No. 2007-507685).

An example of a heat pipe-type electronic component cooler is shown in FIG. 16 (see Patent Reference 1). An electronic component cooler 20 adopts a heat pipe structure by using a sealed space portion 24 formed in a ceramics package 22. By placing the sealed space portion 24 vertically, the sealed space portion 24 is arranged to be long in the vertical direction. A stepped recess 23 is formed inside the ceramics package 22, and a LSI body 25 in which a semiconductor chip (Si Chip) is packaged is mounted as an electronic component in a rear portion 23b. A wick 26a which is a porous material such as an alumina ceramic material is formed along the surface of the LSI body 25 and the recess 23 in the vicinity thereof. The main portion of the ceramics package 22 has a bowl-shape that opens laterally, a side-lid 22a is secured to lateral portion opening, and the sealed space portion 24 is formed from the side-lid 22a and the recess 23. The side-lid 22a is entirely made of a thin plate of ceramic material which is the same material as the ceramics package 22, and the side-lid 22a is a condensing portion which condenses using the working fluid. Deionized water, Freon, and so on is used as the working fluid.

An example of a cooling structure of a multi-chip module, which uses the heat pipe principle is shown in FIG. 17 (see Patent Reference 2). A multi-chip module is configured of a wiring board 33 mounted with plural LSI cases 32 each having a semiconductor device 31 built into it. A heat-transferring block 35 anchored to the wiring board 33 is attached to the wiring board 33 via flanges 34 so as to cover the LSI cases 32. The heat-transferring block 35, together with the wiring board 33, forms a sealed space encapsulating the LSI cases 32. The cooling mechanism is configured to include: the heat-transferring block 35; a working medium channel including a planar wick 39 and a columnar wick 40 which are provided in the heat-transferring block 35; a cooling fluid 37 which flows inside a coolant channel and cools the heat-transferring block 35; and a working medium 38 sealed inside the sealed space. A perfluorocarbon fluid which is non-corrosive and has insulating properties is used as the working fluid. In order to enhance the seal, a sealing material such as a gasket or an O-ring is used between the flange 34 and the heat-transferring block 35.

An example of a semiconductor equipment including a semiconductor chip inside a heat pipe is shown in FIG. 18 (see Patent Reference 3). A semiconductor chip 51 mounted on a mounting board 55 using a mounting material 53 such as solder. The mounting board 55 includes an insulating layer 55a made of a glass fabric base material epoxy resin (glass epoxy) on the surface-side, an insulating layer 55c made of the same glass epoxy on the underside, and a copper plate 5b disposed therebetween. The semiconductor chip 51 is electrically connected, through bonding wires 52, to a line 55d that is made of copper and formed on the surface-side and the underside of the mounting board 55. The line 55d is connected at the surface-side and the underside via through holes 55e having a wall plane covered by glass epoxy. Then, a wick 57 and working fluid 58 made of water, alcohol, or hydrochlorofluorocarbon, and so on, are injected inside a heat pipe 56. The semiconductor chip 51 and the bonding wires 52 are covered by a passivation film made of bisphenol A epoxy resin.

Furthermore, water, methanol, ethanol, acetone, ammonia, a chlorofluorocarbon (CFC) coolant, a hydrochlorofluorocarbon (HCFC) coolant, a hydrofluorocarbon (HFC) coolant, or a mixed coolant thereof are disclosed as a working fluid used in a stand-alone heat pipe that does not include a semiconductor chip (see Patent Reference 4).

SUMMARY OF THE INVENTION

In Patent References 1 and 2, the semiconductor chip is sealed by the ceramics package, and thus the working fluid and the semiconductor chip do not directly come into contact with each other. As a result, since the thermal conductivity of the packaging material is low, the heat of the semiconductor chip surface is not easily transmitted to the working fluid, the semiconductor chip is not cooled, and thus there is the problem that the temperature of the semiconductor chip itself inside the package rises significantly.

In Patent Reference 3, the semiconductor chip is in direct contact with the working fluid and thus heat is diffused from the chip surface directly to the working fluid. However, since GaN and SiC devices is more prone to water corrosion than Si devices, there is the problem that device characteristics deteriorate drastically when water is used in the working fluid. On the other hand, when an organic solvent, such as alcohol or hydrochlorofluorocarbon, and so on, is used as a working fluid, breakdown voltage is low when voltage is applied to the device, and thus there is the problem that the device is destroyed due to electric discharge within the package.

In addition, when the cold portion of the heat pipe is air cooled, the temperature of the semiconductor chip becomes approximately 150° C., the temperature of the cold portion becomes approximately 140° C., and thus pressure inside the heat pipe rises. The relationship between vapor pressure and temperature when ethanol is used in the working fluid is shown FIG. 19. As shown in the figure, when the temperature of the cold portion is equal to or higher than the boiling point of the working fluid (78° C. in the case of ethanol), the inside of the heat pipe is pressurized beyond atmospheric pressure (1 atmosphere). Furthermore, when the working fluid decomposes due to discharge plasma, the pressure inside the package rises dramatically. When the pressure inside the package rises dramatically, there is the problem that the evaporation of the working fluid stops and heat is no longer diffused.

In order to solve the above-described problems, the present invention provides a semiconductor equipment having high heat-transfer effect and breakdown voltage.

In order to solve the above-described problems, the semiconductor equipment according to an aspect of the present invention includes: a sealed container; a stem connected to the sealed container via a stem peripheral portion; and a semiconductor device mounted on a top surface of the stem, inside the sealed container, wherein the semiconductor device is electrically connected to a lead provided to the stem, the stem peripheral portion is bonded along a periphery of the stem, the stem peripheral portion being made of a material that is different from a material of the stem and the same as a material of the sealed container, the stem peripheral portion and the sealed container are connected by welding, the sealed container is filled with a working fluid which is any one of a mixed solution of ethanol and perfluorooctane, a mixed solution of ethanol and perfluorobutyl tetrahydrofuran, and a mixed solution of ethanol and to ethoxynonafluorobutane, and the top surface of the stem on which the semiconductor device is mounted has a concave shape.

According to this configuration, it is possible to provide a semiconductor equipment having a high cooling effect, by using a working fluid which has a latent heat of 70 kJ/kg or higher and includes at least one of ethanol ($C_2H_6O$), a perfluorocarbon, and a fluoroether.

Furthermore, with a perfluorocarbon and a fluoroether, even though it is known that the insulation breaking voltage in liquid is high, it is not known to what degree the insulation breakdown voltage deteriorates when they completely vaporize. However, the inventors have found that, even when vaporized, perfluorooctane, which is a perfluorocarbon, and perfluorobutyl tetrahydrofuran and methoxy nonafluorobutane, which are fluoroethers, have an insulation breakdown voltage of 2000 V. Therefore, by using at least one of ethanol, a perfluorocarbon, and a fluoroether as a working fluid, it is possible to provide a semiconductor equipment which has a high breakdown voltage and does not create electric discharges as in the case of alcohol and hydrochlorofluorocarbon.

Furthermore, it is preferable that the working fluid include a mixed solution of ethanol and perfluorooctane, a mixed solution of ethanol and perfluorobutyl tetrahydrofuran, or a mixed solution of ethanol and ethoxynonafluorobutane, and that the top surface of the stem on which the semiconductor device is mounted have a concave shape.

According to this configuration, perfluorooctane ($C_8F_{18}$), which is a perfluorocarbon, or perfluorobutyl tetrahydrofuran ($C_8F_{16}O$) or ethoxynonafluorobutane ($C_4F_9OC_2H_5$), which are fluoroethers, dissolves in ethanol at 40° C. or higher, and when the temperature of the working fluid reaches 60° C. or higher, ethanol evaporates, the concentration of the perfluorooctane, the perfluorobutyl tetrahydrofuran, or the ethoxynonafluorobutane in the mixed solution rises, and the working fluid separates into the two phases of the ethanol and the perfluorooctane, the perfluorobutyl tetrahydrofuran, or the ethoxynonafluorobutane. With this, after the semiconductor device is driven, ethanol does not evaporate yet while the temperature of the working fluid does not rise up to the phase-separation temperature of the working fluid, and thus the ethanol is in contact with the semiconductor device and can transfer the heat of the semiconductor device. Furthermore, when the temperature of the working fluid rises up to the phase-separation temperature of the working fluid due to the heat generated by the semiconductor device, the surface of the semiconductor device is protected from the ethanol by the perfluorooctane, the perfluorobutyl tetrahydrofuran, or the ethoxynonafluorobutane which has separated from the working fluid, and thus electric discharges due to the vaporized ethanol is suppressed and it is possible to provide a semiconductor equipment having excellent breakdown voltage.

Furthermore, by forming a concave recess in the chip placement region of the stem and placing the semiconductor device in the recess, the perfluorooctane, the perfluorobutyl tetrahydrofuran, or the ethoxynonafluorobutane, which is one of two separated phases, accumulates in the recess and covers the semiconductor device. Furthermore, even when ethanol is present, the surface of the semiconductor device is protected from the ethanol by the perfluorooctane, the perfluorobutyl tetrahydrofuran, or the ethoxynonafluorobutane, and thus it is possible to provide a semiconductor equipment having a high breakdown voltage.

Furthermore, it is preferable that the mixed solution of ethanol and perfluorooctane consist of 90 percent ethanol and 10 percent perfluorooctane.

According to this configuration, setting the concentration of the perfluorooctane in the working fluid to 10%, which is the saturation concentration at which an undissolved portion is not created, facilitates the phase-separation of the perfluorooctane. With this, the surface of the semiconductor device is protected from the ethanol by the perfluorooctane which has separated from the working fluid, and thus electric discharges due to the vaporized ethanol is suppressed and it is possible to provide a semiconductor equipment having excellent breakdown voltage.

Furthermore, it is preferable that the mixed solution of ethanol and perfluorobutyl tetrahydrofuran consist of 70 percent ethanol and 30 percent perfluorobutyl tetrahydrofuran.

According to this configuration, setting the concentration of the perfluorobutyl tetrahydrofuran in the working fluid to 30%, which is the saturation concentration at which an undissolved portion is not created, facilitates the phase-separation of the perfluorobutyl tetrahydrofuran. With this, the surface of the semiconductor device is protected from the ethanol by the perfluorobutyl tetrahydrofuran which has separated from the working fluid, and thus electric discharges due to the vaporized ethanol is suppressed and it is possible to provide a semiconductor equipment having excellent breakdown voltage.

Furthermore, it is preferable that the mixed solution of ethanol and ethoxynonafluorobutane consist of 95 percent ethanol and 5 percent ethoxynonafluorobutane.

According to this configuration, setting the concentration of the ethoxynonafluorobutane in the working fluid to 50%, which is the saturation concentration at which an undissolved portion is not created, facilitates the phase-separation of the ethoxynonafluorobutane. With this, the surface of the semiconductor device is protected from the ethanol by the ethoxynonafluorobutane which has separated from the working fluid, and thus electric discharges due to the vaporized ethanol is suppressed and it is possible to provide a semiconductor equipment having excellent breakdown voltage.

Furthermore, it is preferable that the working fluid include any one of sulfur hexafluoride, perfluorohexane, perfluoroheptane, perfluorooctane, methoxy nonafluorobutane, dodecafluorooctanol, and perfluorotripropylamine.

According to this configuration, since the working fluid includes any one of: sulfur hexafluoride ($SF_6$); perfluorohexane ($C_6F_{14}$), perfluoroheptane ($C_7F_{16}$), and perfluorooctane which are perfluorocarbons; methoxy nonafluorobutane ($C_4F_9OCH_3$) and dodecafluorooctanol ($C_3HF_6$—$CH(CH_3)$ O—$C_3HF_6$) which are fluoroethers; and perfluorotripropylamine ($C_9F_{21}N$), it is possible to provide a semiconductor equipment having high heat-transfer effect and breakdown voltage.

Furthermore, it is preferable that the stem peripheral portion be connected to a bottom portion of the stem by brazing so as to be coplanar with the bottom portion.

According to this configuration, the stem and the stem peripheral portion are brazed using silver braze, copper braze, and so on, so as to be coplanar, and thus it is possible to provide a semiconductor equipment having high hermetic pressure resistance against the pressure inside the sealed container.

Furthermore, it is preferable that the lead be placed inside a lead hole formed in the stem, that the lead have a smaller diameter at a bottom-side of the stem than at a top-side of the stem, and that the lead hole have a smaller diameter at a bottom-side of the stem than at a top-side of the stem.

According to this configuration, it is possible to provide a semiconductor equipment having high hermetic pressure resistance.

Furthermore, it is preferable that when pressure inside the sealed container is represented by P (MPa) and volume by V ($m^3$), a value of P×V is equal to or less than 0.004.

Furthermore, it is preferable that the semiconductor device be connected to the lead using bonding wire, and that the semiconductor device and the bonding wire are covered with a passivation film.

According to this configuration, since the bonding is protected by the passivation film, it is possible to provide a semiconductor equipment having high insulation breakdown resistance.

Furthermore, it is preferable that the semiconductor device be flip-chip mounted on the stem.

Furthermore, it is preferable that the semiconductor device be connected onto the stem using a conductive resin.

Since the surface of the semiconductor device is dramatically cooled when the surface of the semiconductor device is cooled directly by the working fluid, a large temperature distribution is created inside the semiconductor device and there are cases where the semiconductor device is destroyed due to thermal strain when the temperature of the semiconductor device becomes 150° C. or higher. According to this configuration, by using a conductive resin as the bonding material for the semiconductor device, it is possible to provide a semiconductor equipment that is capable of suppressing the thermal strain caused by the temperature deviation, through the elastic deformation of the conductive resin.

Furthermore, it is preferable that the semiconductor device be made of a semiconductor that includes a nitride semiconductor or silicon carbide or diamond.

According to this configuration, it is possible to provide a semiconductor equipment having a high heat-transfer effect, by using GaN or SiC, which have high thermal conductivity, as the semiconductor substrate.

Furthermore, it is preferable that the semiconductor device includes a hetero semiconductor thin film formed on a sapphire substrate or a silicon substrate.

According to this configuration, heat is easily conducted since thermal resistance is large in a device for high-power use that is made of a hetero semiconductor thin film such as GaN, SiC, diamond, and so on, formed on a silicon or sapphire substrate. Therefore, it is possible to provide a semiconductor equipment having a high heat-transfer effect.

Furthermore, it is preferable that the semiconductor device include, in a surface of the semiconductor device, an aluminum nitride film or a polycrystalline diamond film.

According to this configuration, by dispersing the heat generated at the drain end of the gate electrode over the entire surface of the semiconductor device through the highly thermal-conductive dielectric film which has a large surface area for heat-transfer, the heat-transfer characteristics from the surface of the semiconductor device can be improved. With this, aside from the substrate, heat can be effectively transferred from the surface of the semiconductor thin film made of GaN, and so on. Furthermore, even without using GaN or SiC as the semiconductor substrate, it is possible to use a silicon substrate or a sapphire substrate which have lower thermal conductivity and lower cost since it is possible to transfer heat from the surface of the semiconductor device.

Furthermore, it is preferable that the semiconductor device, the bonding wire, and the stem include an insulating dielectric film in a surface of the semiconductor device, the bonding wire, and the stem.

According to this configuration, a solvent such as ethanol, perfluorohexane, perfluoroheptane, perfluorooctane, perfluorobutyl tetrahydrofuran, or methoxy nonafluorobutane does not penetrate inside the insulating coating film, and the wire, chip, and stem surface are protected. With this, it is possible to provide a semiconductor equipment which has a high breakdown voltage, and in which electric discharge does not occur even at 2000 V or higher.

Furthermore, it is preferable that the insulating dielectric film be made of aluminum nitride or diamond.

According to this configuration, since the semiconductor device is insulation-coated with aluminum nitride or diamond which have excellent insulating properties, the aforementioned solvent does not penetrate into the semiconductor device, and thus it is possible to provide a semiconductor equipment having a high breakdown voltage.

In order to solve the above-described problems, the method of manufacturing a semiconductor equipment according to an aspect of the present invention includes: brazing a stem peripheral portion onto a stem, the stem peripheral portion being made of a material that is different from a material of the stem; forming a lead hole in the stem; placing a lead inside the lead hole, filling a gap between the lead hole and the lead with a ceramic having a same thermal expansion coefficient as the stem and the lead, and baking the ceramic; mounting a semiconductor device onto a top surface of the stem; bonding the semiconductor device and the lead using bonding wire or a ribbon; connecting a sealed container to the stem peripheral portion by welding, the sealed container being made of a same material as the stem peripheral portion; creating a vacuum inside the sealed container by evacuating air via an air evacuation pipe provided in the sealed container; injecting a working fluid into the sealed container, in a vacuum state; and sealing the air evacuation pipe, wherein the sealed container is filled with the working fluid which includes at least one of ethanol, a perfluorocarbon, and a fluoroether.

According to this configuration, a semiconductor equipment having the above-described characteristics can be easily manufactured.

The present invention can provide a semiconductor equipment having high heat-transfer effect and breakdown voltage, and a method of manufacturing the same.

FURTHER INFORMATION ABOUT TECHNICAL BACKGROUND TO THIS APPLICATION

The disclosure of Japanese Patent Application No. 2010-053874 filed on Mar. 10, 2010, including specification, drawings and claims is incorporated herein by reference in its entirety.

The disclosure of PCT application No. PCT/JP2010/005515 filed on Sep. 9, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 8A is a table indicating states of solubility of the working fluid of the semiconductor equipment according to Embodiment 1 of the present invention;

FIG. 8B is a table indicating states of solubility of the working fluid of the semiconductor equipment according to Embodiment 1 of the present invention;

FIG. 14 is a cross-sectional view of the semiconductor equipment according to Embodiment 5 of the present invention;

DESCRIPTION OF THE PREFERRED EMBODIMENTS

Hereinafter, embodiments of the present invention shall be described with reference to the Drawings. It should be noted that although the present invention shall be described with reference to the following embodiments and the Drawings, this is merely for exemplification and is not intended to limit the present invention to such embodiments and Drawings.

Embodiment 1

Figure 1A:
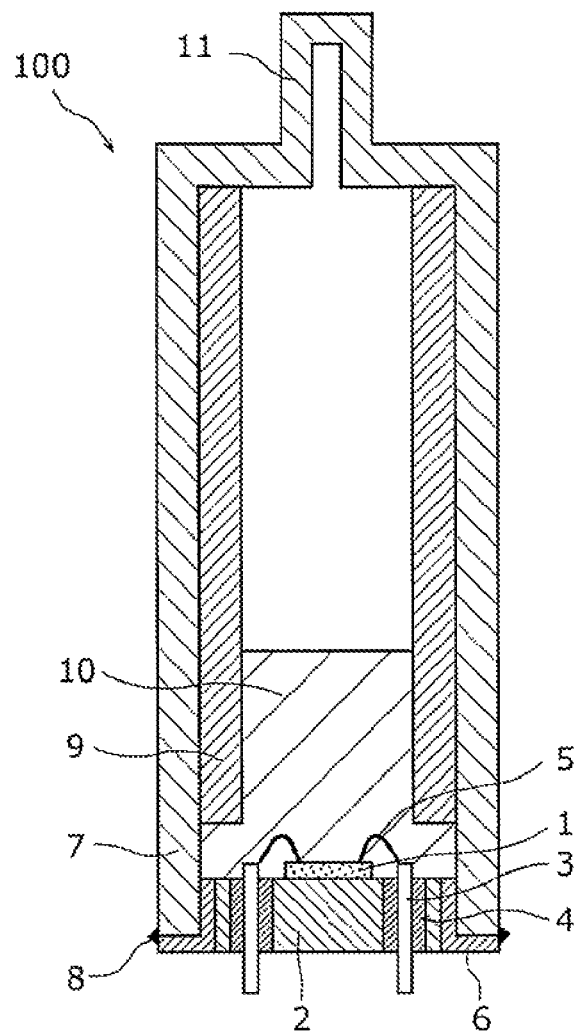
FIG. 1A is a cross-sectional view of a semiconductor equipment according to Embodiment 1 of the present invention.
Figure 1B:
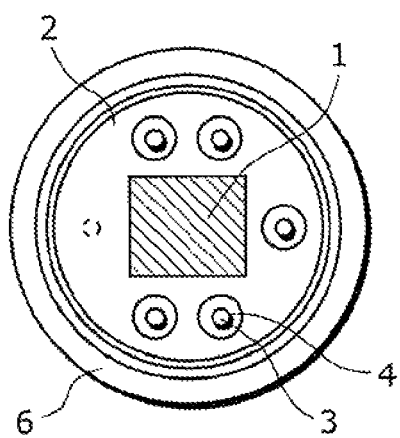
FIG. 1B is a cross-sectional view of a stem of the semiconductor equipment according to Embodiment 1 of the present invention.
Figure 2:
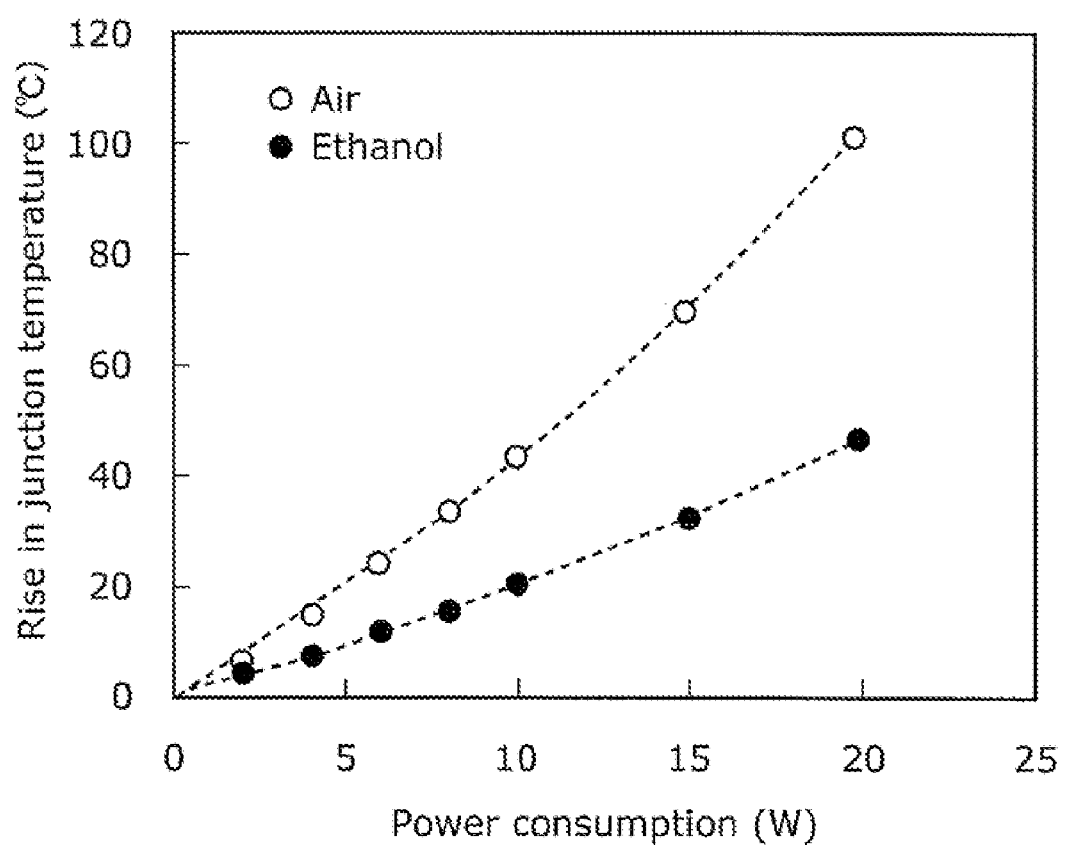
FIG. 2 is a graph showing the relationship between the rise in junction temperature and power consumption, in the semiconductor equipment according to Embodiment 1 of the present invention.
Figure 3:
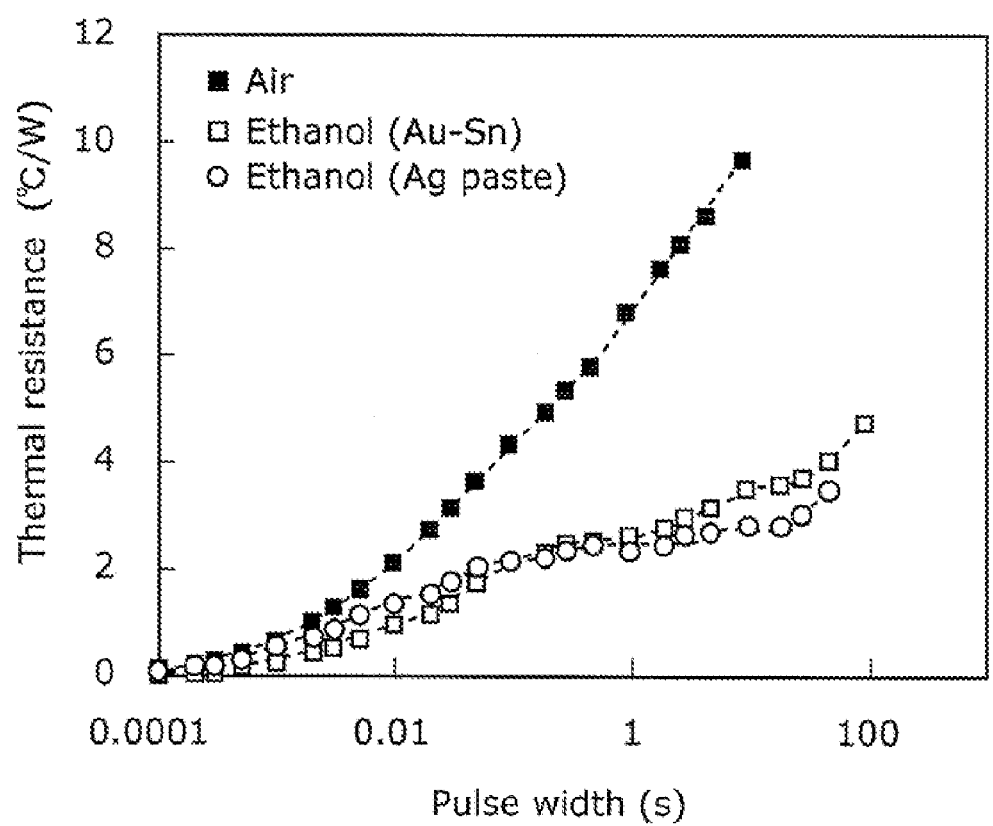
FIG. 3 is a graph showing the relationship between thermal resistance and pulse width, in the semiconductor equipment according to Embodiment 1 of the present invention.
Figure 4A:
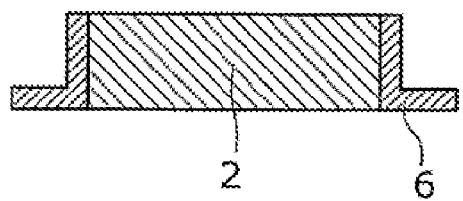
FIG. 4A is a diagram for describing a method of manufacturing the semiconductor equipment according to Embodiment 1 of the present invention.
Figure 4B:
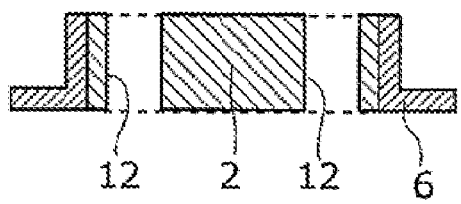
FIG. 4B is a diagram for describing the method of manufacturing the semiconductor equipment according to Embodiment 1 of the present invention.
Figure 4C:
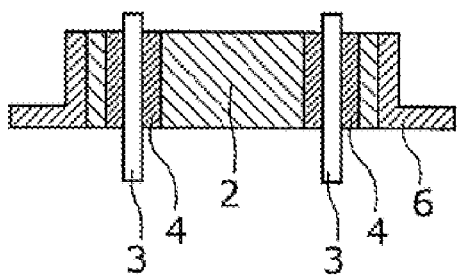
FIG. 4C is a diagram for describing the method of manufacturing the semiconductor equipment according to Embodiment 1 of the present invention.
Figure 4D:
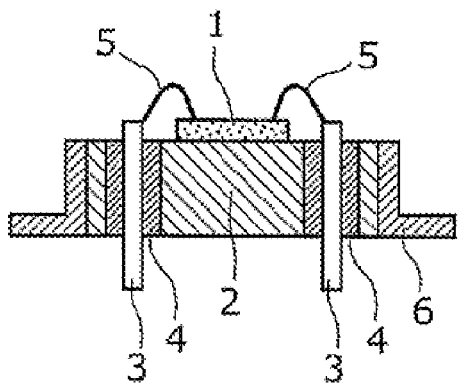
FIG. 4D is a diagram for describing the method of manufacturing the semiconductor equipment according to Embodiment 1 of the present invention.
Figure 5:
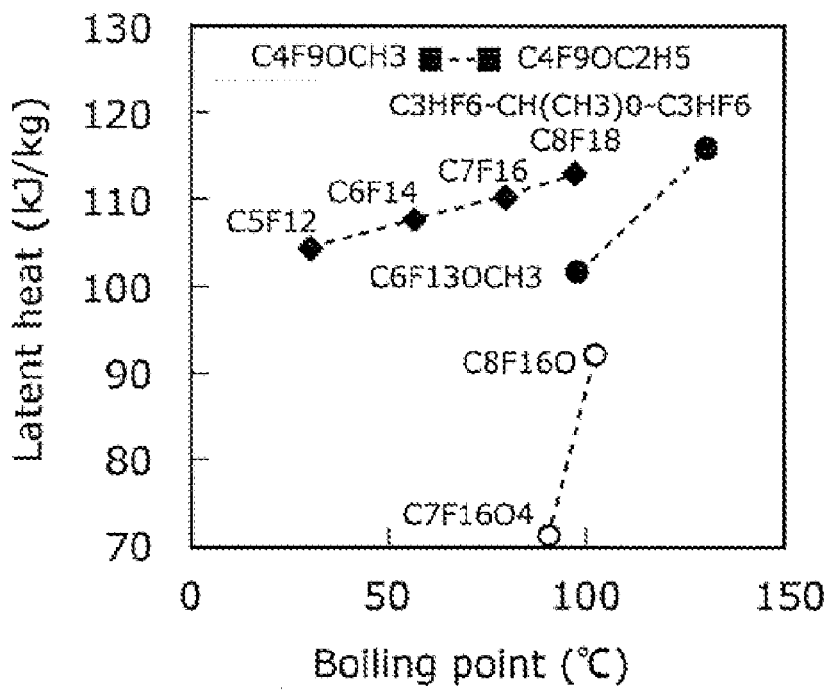
FIG. 5 is a graph showing the relationship between the latent heat and the boiling point of the working fluid, in a semiconductor equipment according to Embodiment 5 of the present invention.
Figure 6:
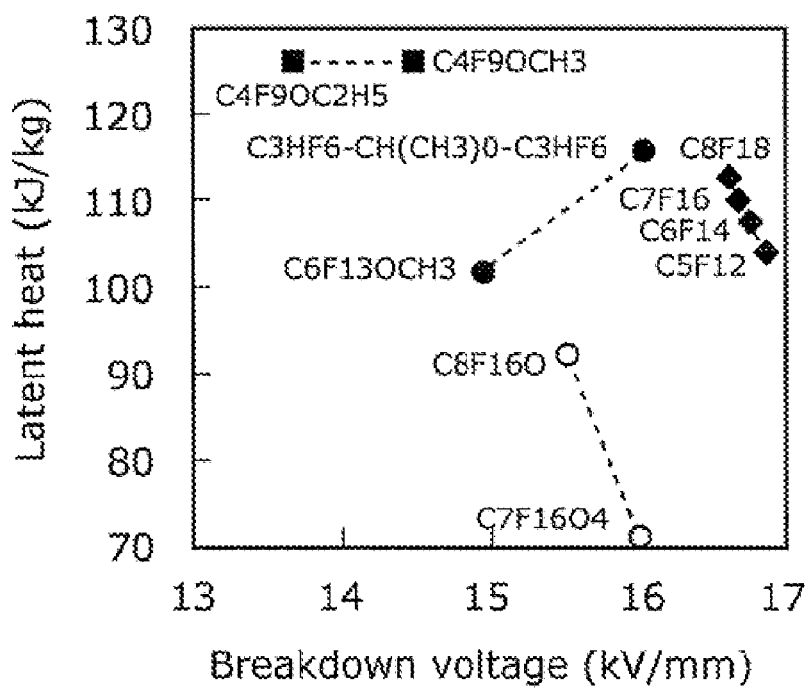
FIG. 6 is a graph showing the relationship between the latent heat of the working fluid and the insulation breakdown voltage, in the semiconductor equipment according to Embodiment 5 of the present invention.
Figure 7:
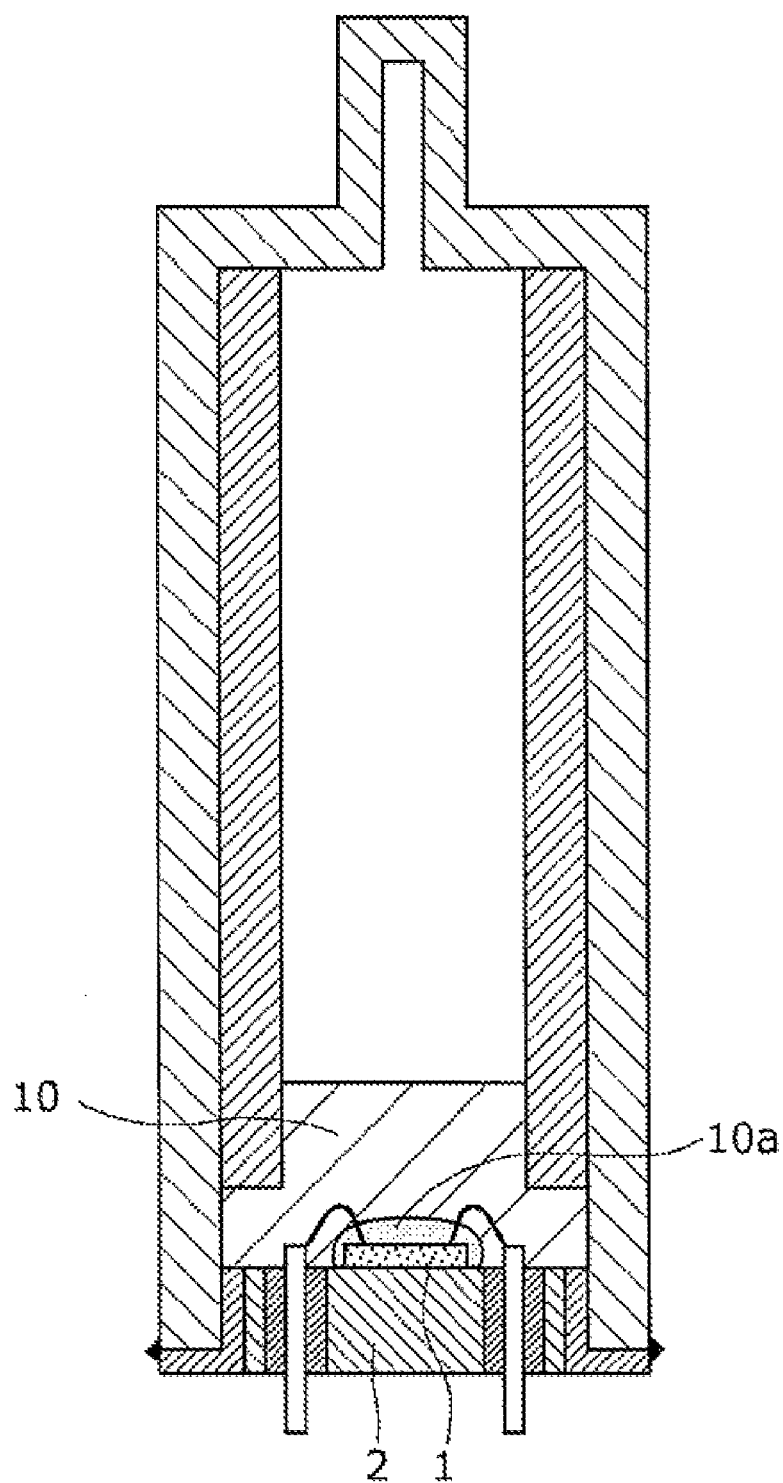
FIG. 7 is a cross-sectional view of the semiconductor equipment for describing the cooling effect and the breakdown voltage of the semiconductor equipment according to Embodiment 1 of the present invention.

FIG. 1A is a cross-sectional view of a semiconductor equipment according to Embodiment 1 of the present invention. Furthermore, FIG. 1B is a bottom view of a stem of the semiconductor equipment shown in FIG. 1A. FIG. 2 is a graph showing the relationship between the rise in junction temperature and power consumption, in the semiconductor equipment according to the present embodiment. FIG. 3 is a graph showing the relationship between thermal resistance and pulse width, in the semiconductor equipment according to the present embodiment. FIG. 4A to FIG. 4F are diagrams for describing a method of manufacturing the semiconductor equipment according to the present embodiment. FIG. 5 is a graph showing the relationship between the latent heat and boiling point of the working fluid, in the semiconductor equipment according to the present embodiment. FIG. 6 is a graph showing the relationship between the latent heat of the working fluid and insulation breakdown voltage, in the semiconductor equipment according to the present embodiment. FIG. 7 is a diagram for describing the generation of a second phase in the working fluid of the semiconductor equipment according to the present embodiment. FIG. 8A and FIG. 8B are tables indicating states of solubility of the working fluid of the semiconductor equipment according to the present embodiment.

As shown in FIG. 1A, a semiconductor equipment 100 according to the present embodiment includes a semiconductor chip 1, a stem 2, leads 3, ceramic 4, bonding wires 5, a stem peripheral portion 6, a sealed container 7, a welding portion 8, a wick 9, and a working fluid 10.

The semiconductor chip 1, which corresponds to a semiconductor device according to the present embodiment, is formed on a silicon or sapphire substrate, and is mounted at a center portion of the metal stem 2 as shown in FIG. 1B, by using a bonding agent such as solder or silver paste.

The semiconductor chip 1 is configured of a GaN power transistor, specifically, a heterojunction field-effect transistor having a AlGaN/GaN hetero structure, and high current, high forward breakdown voltage, and low on-resistance are realized.

Here, when a device for high-power use that is made of a hetero semiconductor thin film such as GaN, SiC, diamond, and so on, the thermal resistance of the semiconductor chip 1 is high. This is because the thermal conductivity of substrates made of silicon and sapphire are 150 W/m·K and 20 W/m·K, respectively, which is low compared to the 490 W/m·K of SiC and the 400 W/m·K of Cu. In addition, PbSn solder which is widely used as a bonding agent for bonding the semiconductor chip 1 to the stem 2 has a thermal conductivity of 35 W/m·K, and AuSn solder has a thermal conductivity of 57 W/m·K, and silver paste has a thermal conductivity of 23 W/m·K. Therefore, in the device for high-power use, it is difficult for the heat, which is generated in a semiconductor thin film region made of the GaN, and so on, in which electrons travel, to transfer through the substrate and bonding agent.

Consequently, if heat can be effectively transferred to the working fluid 10, not only from the substrate, but from the surface of the semiconductor thin film made of GaN, and so on, the temperature of the semiconductor chip 1 can be significantly decreased. In particular, the heat-transfer effect of the working fluid 10 is more prominent in a device on a sapphire substrate than in a device on a silicon substrate.

In the present invention, GaN or Sic need not be used for the semiconductor substrate, and a silicon substrate or a sapphire substrate which have low thermal conductivity and low cost can be used as the substrate of the semiconductor chip 1. In this case, it preferable that the surface of the semiconductor chip 1 be coated with a highly thermal-conductive dielectric film. This is because even among semiconductor thin films made of GaN, SiC, diamond, and so on, a large amount of heat is generated in an extremely narrow region such as the drain-side end of the gate electrode. In transferring heat from the semiconductor surface to the working fluid 10, thermal resistance decreases as the surface area for heat-transfer increases. The heat generated at the drain-end of the gate electrode is dispersed over the entire surface of the semiconductor chip 1 through the highly thermal-conductive dielectric film, thereby improving the heat-transfer characteristics from the surface of the semiconductor chip 1.

In the present embodiment, an aluminum nitride film, a zinc oxide film, or a diamond film is used as the highly thermal-conductive dielectric film in the case of a GaN power transistor. This is because, compared to the approximately 30 W/m·K thermal conductivity of alumina film or silicon oxide film which are dielectric films generally used in the surface coating of the semiconductor chip 1, the thermal conductivity of zinc oxide, aluminum nitride, and diamond are higher at 60 W/m·K, 200 W/m·K, and 2000 W/m·K, respectively.

In the present embodiment, since the highly thermal-conductive dielectric film comes into contact with the working fluid, a zinc oxide film or a diamond film is selected as a material that is resistant to working fluid corrosion compared to an alumina film or a silicon oxide film. On the other hand, an aluminum nitride film has the property of being etched by the presence of water. In addition, GaN and SiC itself is more prone to corrosion by water than Si. In view of this, it is preferable to use, as the working fluid, ethanol, perfluorohexane, perfluoroheptane, perfluorooctane, perfluorobutyl tetrahydrofuran, methoxy nonafluorobutane, or a fluorinated inert liquid such as sulfur hexafluoride, which do not use water. As a result, aside from being able to obtain approximately the same cooling effect as water, high insulation breakdown resistance can be obtained even with a change to the gaseous state. It should be noted that the working fluid 10 will be described in detail later.

The center portion of the stem 2 is formed of an iron-based material (for example, SPCE).

The semiconductor chip 1 is electrically connected to the leads 3 made of an iron-based material, through plural bonding wires 5, and is electrically connected to the outside of a heat pipe formed from the stem 2 and the sealed container 7.

The gap between each of the leads 3 and the stem 2 is filled with the ceramic 4 which is made of a glass component having a thermal expansion coefficient that is the same as that of iron. In order to obtain high hermetic pressure resistance, there is a hermetic seal structure of fused glass between the lead 3 and the stem 2. With this configuration, the working fluid 10 such as ethanol, a perfluorocarbon, a fluoroether, and so on, does not seep-in between the lead 3 and the stem 2. Specifically, in the case of a GaN and SiC device, the device temperature becomes a high temperature of 150° C. or higher, and the hot working fluid 10 comes into contact with a component making up the stem 2. It should be noted that, as in the conventional technique, when glass epoxy, and the like, is used as a constituent component, the working fluid 10 penetrates the constituent component made of glass epoxy, and the like, and sealing strength deteriorates. By using a hermetic seal structure, the pressure inside the heat pipe is made to have a hermetic pressure resistance of up to approximately 29 atmospheres.

Furthermore, by likewise adopting a hermetic seal structure including a metal weld and the ceramic 4 for the container seal, it is possible to realize 1000 hours or more of stable operation without the seepage of the working fluid 10 such as alcohol, hydrochlorofluorocarbon, a perfluorocarbon, a fluoroether, or a fluorinated inert liquid such as sulfur hexafluoride.

Furthermore, by making the gap between each of the leads 3 and the stem 2 1 mm or more, a 1000 V insulation break voltage is obtained. The stem peripheral portion 6 surrounding the stem 2 is made from a copper-based material (for example, oxygen free copper: OFHC).

In order to obtain high hermetic pressure resistance, the stem 2 and the stem peripheral portion 6 are brazed with silver braze or copper braze so as to be coplanar.

Since the stem 2 is made of an iron-based material and the stem peripheral portion 6 is made of a copper-based material, the present embodiment is characterized in that materials having different thermal expansion coefficients are connected by brazing.

Specifically, although the sealed container 7 making up the heat pipe is made of a copper-based material and the leads 3 and the stem 2 are formed from an iron-based material because the hermetic seal structure requires the use of an iron-based material having a thermal expansion coefficient close to that of the ceramic 4, in the case of welding a copper-based material and an iron-based material, sufficient bonding is not possible due to the brittleness of the connection formed by the alloying of copper and iron.

Furthermore, even when they are welded, the weld is easily destroyed due to the difference in thermal expansion coefficients. Therefore, the parts to be welded must be made of the same material. In view of this, a characteristic feature is that the stem peripheral portion 6 of the same material as the sealed container 7 is not welded to the circumference of the stem 2, but is instead connected by brazing.

The sealed container is bonded to the stem peripheral portion 6 by welding. Since the semiconductor chip 1 is mounted on the stem 2 using solder or silver paste, the temperature at the time of welding must be set to 200° C. or lower so that the solder does not melt again. Laser spot welding using a YAG laser beam or ultrasound welding and radio-frequency welding which allow welding at low temperature can be used in the welding. In the case of the present embodiment, YAG laser spot welding is used in order to obtain high hermetic pressure resistance.

The sealed container 7 includes, inside thereof, the wick 9 and the working fluid 10 made of water, ethanol, a perfluorocarbon, a fluoroether, methoxy nonafluorobutane, or a fluorinated inert liquid, and so on, and the semiconductor chip 1 is immersed in the working fluid 10. In the present embodiment, any of the following liquids, which have minimal effect when seeping into the GaN, and so on, and through which latent heat from evaporation can be obtained, is used as the working fluid 10: ethanol ($C_2H_6O$); perfluorohexane ($C_6F_{14}$), perfluoroheptane ($C_7F_{16}$) or perfluorooctane ($C_8F_{18}$) which are perfluorocarbons; or perfluorobutyl tetrahydrofuran ($C_8F_{16}O$) or methoxy nonafluorobutane ($C_4F_9OCH_3$) which are fluoroethers. An air evacuation pipe 11 located on the top portion of the sealed container 7 is structured such that the open tip is sealed after the heat pipe is injected with the working fluid 10 and brought to a vacuum state, and then becomes 100% filled with the gas of the working fluid.

In the present embodiment, the size of the semiconductor chip is 5 mm square, and five of the leads 3 are arranged around an identical center. A lead hole formed in the stem 2 is 1.8 mm, and the gap between the lead 3 and the stem 2 is 1 mm or more. The outer diameter of the stem peripheral portion 6 is 15 mm, and laser spot welding is made possible by likewise setting the outer diameter of the sealed container 7 at 15 mm.

In order to transfer the several watts or more of heat generated from the semiconductor chip 1, it is preferable that the sealed container 7 making up the heat pipe have an inner diameter of 1 to 10 cm and a length of approximately 10 to 100 cm. A passivation film may be provided to the semiconductor chip 1 for protection from the working fluid. When the pressure and volumetric capacity of the inside of the heat pipe is represented as P [MPa] and V [m$^3$], respectively, it is preferable that the value of P×V be equal to or less than 0.004. Since pressure is 3 MPa at 200° C. in the case of ethanol, and the inner diameter of the heat pipe is 13 mm in the present embodiment, the length of the heat pipe is set at 125 cm or less.

Furthermore, in order to efficiently transfer the heat that has migrated, using the heat pipe, a heat sink, an air-cooling device, and so on may be provided accordingly.

FIG. 2 is a graph showing the power consumption and the rise in junction temperature when voltage and current are provided to the semiconductor chip 1. The applied voltage between the drain and source is set to 10 V to cause the drain current to change from 0.2 A to 2 A. In FIG. 2, the duration for applying voltage between the drain and source is 0.1 second. The closed circles (ethanol) indicate the results when ethanol is enclosed as the working fluid 10, and open circles (air) indicate, for comparison, the result when the working fluid 10 is not enclosed in the heat pipe. When 20 W is applied, the temperature of the junction (junction temperature) drops by 55° C., from the 100° C. when there is no working fluid 10, to the 45° C. when ethanol is enclosed. Furthermore, when comparing at the same junction temperature (42° C.), it was confirmed that the amount of power that can be inputted doubles, from the 10 W when there is no working fluid 10, to the 20 W when ethanol is enclosed.

FIG. 3 is a graph showing the thermal resistance when the duration for which voltage is applied between the drain and the source is changed from 100µ seconds to 100 seconds. The thermal resistance is defined in FIG. 2 as the result of dividing the junction temperature by the power consumption. The applied voltage between the drain and source is set to 10 V, and the drain current is set to 1 A. In FIG. 3, the open squares (ethanol, Au—Sn) indicate the case where the ethanol is enclosed as the working fluid 10 and the semiconductor chip 1 is mounted to the stem 2 using Au—Sn eutectic solder, and the open circles (ethanol, Ag paste) indicate the case where ethanol is enclosed as the working fluid 10 and the semiconductor chip 1 is mounted to the stem 2 using silver paste as a conductive resin paste. Furthermore, closed squares (air) indicate, for comparison, the results when the working fluid 10 is not enclosed inside the heat pipe.

As shown in FIG. 3, when the working fluid 10 is not enclosed, thermal resistance increases monotonically as the pulse width is increased. On the other hand, in the case where ethanol is enclosed as the working fluid 10, a different thermal resistance value is indicated in 1 m second, regardless of the mounting method, compared to when the working fluid 10 is not enclosed. The thermal resistance value was 0.3° C./W, and this becomes the thermal resistance value in the surface of the semiconductor chip 1. On the other hand, when the working fluid 10 is not enclosed, the rate of increase of the thermal resistance value showed a slight inclination towards saturation in 0.1 second. The thermal resistance value becomes 4° C./W and is equivalent to the thermal resistance when heat-transfer from the semiconductor substrate is carried out. Based on the above description, the thermal resistance value when the semiconductor equipment 100 according to the present embodiment is used becomes 0.3° C./W, and thus becomes approximately 1/10 of the 4° C./W which is the thermal resistance value of a normal semiconductor chip 1, and thus heat-transfer can be performed sufficiently even when the GaN device has 10 times the heat density of a MOSFET.

In addition, in the case where the semiconductor chip 1 is supplied with a voltage of 240 V and a current of 20 A, and driven at 90% efficiency when the semiconductor equipment 100 in the present invention is used, the maximum temperature of the semiconductor chip 1 was 150° C. even when 500 W of heat was generated, and the upper end portion of the sealed container 7 provided with radiation fins was 140° C. Based on this, driving up to a semiconductor junction temperature of 150° C. to 200° C. is possible even for high-voltage, high-current power electronics use.

Next, a method of manufacturing the semiconductor equipment 100 in the present invention shall be described with reference to FIG. 4A to FIG. 4F. First, as shown in FIG. 4A, the stem peripheral portion 6 which is made of a copper-based material is brazed to the periphery of the stem 2 which is made of an iron-based material, and is notched through a cutting process. Next, as shown in FIG. 4B, lead holes 12 are formed in the stem 2 by a cutting process. Next, as shown in FIG. 4C, after the leads 3 are passed through the lead holes 12, they are baked so as to be hermetically sealed using the ceramic 4. Next, as shown in FIG. 4D, the semiconductor chip 1 is mounted on the stem by mounting using solder or silver paste, and the semiconductor chip 1 and the leads 3 are bonded so as to be conductive, using the bonding wires 5 which are made of gold or aluminum lines or ribbons.

Figure 4E:
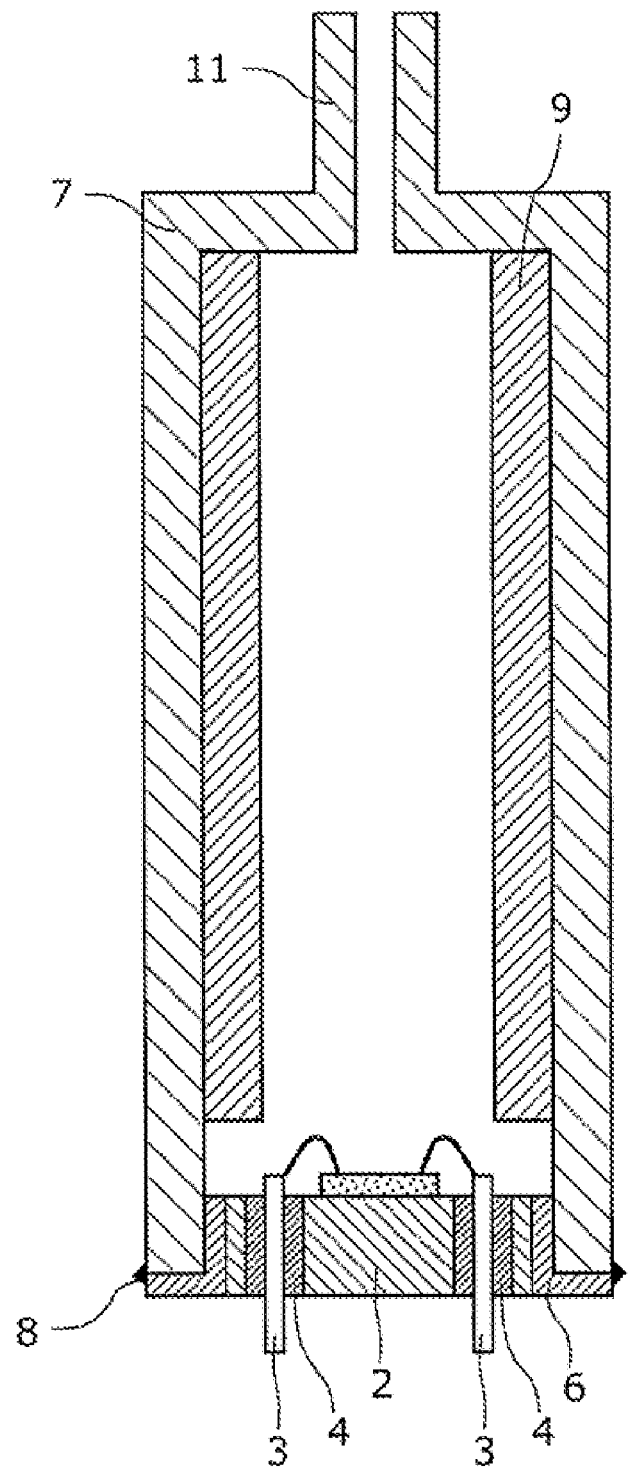
FIG. 4E is a diagram for describing the method of manufacturing the semiconductor equipment according to Embodiment 1 of the present invention.
Figure 4F:
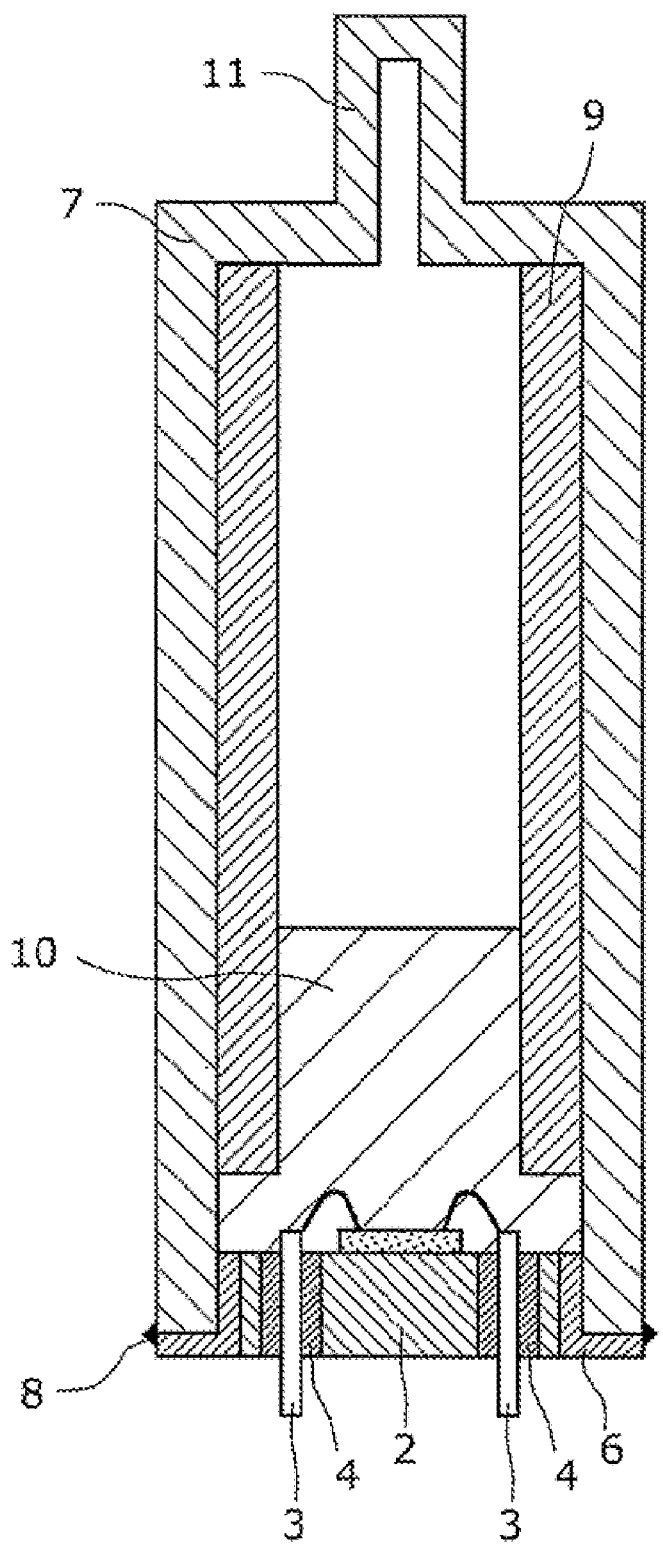
FIG. 4F is a diagram for describing the method of manufacturing the semiconductor equipment according to Embodiment 1 of the present invention.

Furthermore, as shown in FIG. 4E, the wick 9, which is made of metal wire or metal mesh, is inserted inside the sealed container 7 and joined to the inner wall of the sealed container 7, after which the air evacuation pipe 11 is sealed by welding. Subsequently, the stem 2 on which the semiconductor chip 1 is mounted is inserted into the sealed container 7, and the sealed container 7 and the welding portion 8 of the stem peripheral portion 6 are joined by laser spot welding. Furthermore, as shown in FIG. 4F, the working fluid 10, which is made of water, alcohol, hydrochlorofluorocarbon, a perfluorocarbon, a fluoroether, or a fluorinated inert liquid such as sulfur hexafluoride, and so on, is placed inside the sealed container 7, and the inside of the sealed container 7 is brought to a vacuum state and filled with the working fluid gas. Lastly, by closing the tip of the air evacuation pipe 11 which is open in the decompressed state, the heat pipe is completed. As a method of sealing the air evacuation pipe 11 which is the pipe tip, a structure is adopted whereby the tip is soldered or welded after being clamped, so as to withstand pressure and maintain hermeticity.

Meanwhile, when the working fluid 10 completely evaporates, the surface of the semiconductor chip 1 can no longer be sufficiently cooled, and the surface of the semiconductor chip 1 heats up significantly. As such, a large temperature deviation is created inside the semiconductor chip 1, and when the temperature of the semiconductor chip 1 is 150° C. or higher, there are cases where the semiconductor chip 1 is destroyed due to the thermal strain. Since the present embodiment uses silver paste, which is a conductive resin, as the mounting material of the semiconductor chip 1, the silver paste softens due to excessive heat and the thermal strain due to the temperature deviation is suppressed by the elastic deformation of the silver paste, and thus the destruction of the semiconductor chip 1 can be prevented.

It should be noted that although wire bonding is performed on the semiconductor chip 1 and the leads 3 using the bonding wires 5 in the present embodiment, flip-chip mounting may be performed.

Next, the working fluid 10 shall be described.

In the semiconductor equipment 100 of the present embodiment, a voltage of, for example, 240 V is applied to the semiconductor chip 1. However, a voltage of 2000 V or higher is applied to the semiconductor chip 1 that is used in automobiles, electric trains, and so on.

When such a large voltage is applied to the semiconductor chip 1, it is necessary to suppress the electric discharge occurring between electrode pads of the surface of the semiconductor chip 1 or between the stem 2 and the leads 3. In order to suppress electric discharge, it is necessary to use the working fluid 10 having a high insulation breakdown voltage. Here, "insulation breakdown voltage" refers to the maximum voltage at which an electric discharge does not occur between the electrode pads of the surface of the semiconductor chip 1 or between the stem 2 and the leads 3 under a specific condition. Therefore, the working fluid 10 that is used in a semiconductor equipment used in an automobile or an electric train is required to have a high breakdown voltage in addition to having high cooling efficiency.

Conventionally, water or ethanol used as the working fluid 10 has low insulation breakdown voltage. Specifically, the insulation breakdown voltage of water vapor is approximately 1 kV/mm, and the insulation breakdown voltage of ethanol vapor is approximately 5 kV/mm. In the present embodiment, it is preferable that the working fluid 10 having a higher insulation breakdown voltage than water and ethanol be used.

Specifically, the working fluid 10 which satisfies the three conditions given below shall be studied.

The first condition is that the working fluid 10 is in the liquid state during the enclosing in the semiconductor equipment 100. During the enclosing in semiconductor equipment 100, the temperature of the working fluid 10 is, for example, at least 20° C. to 25° C.

When the working fluid 10 is in the liquid state during the enclosing of the working fluid 10 in the semiconductor equipment 100, the working fluid 10 can be poured into the sealed container 7 though the air evacuation pipe 11 as shown in FIG. 4E. It should be noted that when the working fluid 10 solidifies at 25° C., such working fluid 10 cannot be used because stress generated by the solidification creates significant force in the semiconductor chip 1 and the bonding wires 5 and thereby becoming a cause for destruction. Furthermore, when the working fluid 10 vaporizes at 20° C., conversion from gas to liquid inside the sealed container 7 is required after enclosing, and thus the sealed container 7 needs to be cooled to a very low temperature at which the working fluid 10 liquefies, and thus the operation becomes complicated. In addition, since the temperature inside the sealed container 7 becomes approximately 25° C. when the semiconductor equipment 100 is stored, the working fluid 10 that vaporizes at 20° C. cannot be used because the working fluid 10 completely vaporizes such that the pressure inside the sealed container becomes very high, thus becoming a cause for the rupturing of the sealed container 7.

The second condition is that the liquid have a boiling point that is greater than 25° C. and less than 150° C. so that the temperature of the semiconductor chip 1 becomes less than 150° C.

By selecting the working fluid 10 having a boiling point that is greater than 25° C., the pressure inside the sealed container 7 does not become greater than 1 atmosphere even when the temperature of the sealed container 7 during storage is 25° C. Furthermore, by having a boiling point of 150° C. or lower, a high cooling efficiency can be achieved. This is because, the working fluid 10 completely vaporizes when the temperature of the semiconductor chip 1 is at least 150° C., and thus the working fluid 10 is no longer present on the semiconductor chip 1, that is, a high cooling efficiency for the semiconductor chip 1 is realized due to the latent heat of vaporization of the working fluid 10. When the boiling point is greater than 150° C., a large amount of the non-vaporized working fluid 10 remains on the semiconductor chip 1 and sufficient cooling efficiency cannot be realized even when the temperature of the semiconductor chip 1 becomes 150° C., and thus the temperature of the semiconductor chip 1 may rise up to the boiling point of the working fluid 10 thereby causing the deterioration of the semiconductor chip 1.

The third condition is that the liquid have a latent heat that is equal to or greater than 70 kJ/kg.

By selecting such a fluid, it becomes possible to cool an element that generates heat of 500 Ws or higher, which is required in a semiconductor equipment used in an automobile, electric train, and so on.

As the working fluid 10 that satisfies the above-described conditions, it is preferable to select a fluorinated inert liquid having a boiling point that is greater than 25° C. and less than 150° C., for example.

FIG. 5 shows the relationship between the latent heat and the boiling point of 10 kinds of fluorinated inert liquids satisfying the above-described conditions. It should be noted the 10 kinds of fluorinated inert liquids shown in FIG. 5 do not destroy the ozone layer. Furthermore, the 10 kinds of fluorinated inert liquids have a low warming effect and low toxicity. Hereinafter, these liquids shall be referred to under the collective term "10 kinds of fluorinated inert liquids".

Among the 10 kinds of fluorinated inert liquids shown in FIG. 5, the perfluorocarbons are $C_5F_{12}$, $C_6F_{14}$, $C_7F_{16}$, and $C_8F_{18}$. Furthermore, fluoroethers are $C_4F_9OCH_3$, $C_4F_9OC_2H_5$, $C_3HF_6$—$CH(CH_3)O$—$C_3HF_6$, $C_6F_{13}OCH_3$, $C_8F_{16}O$, and $C_7F_{16}O_4$.

Generally, a fluorinated inert liquid is known to have a higher insulation breakdown voltage than alcohol. However, the degree of insulation breakdown voltage that would be exhibited when these liquids completely vaporize was not known. However, the inventors have found that, even when vaporized, an insulation breakdown voltage of 14 kV/mm or higher can be obtained from perfluorohexane, perfluoroheptane, perfluorooctane, perfluorobutyl tetrahydrofuran, or methoxy nonafluorobutane. This is an insulation breakdown voltage that is double the 5 kV/mm insulation breakdown voltage of ethanol. Furthermore, with regard to cooling effect, it was found out that approximately the same degree of cooling effect can be obtained by using ethanol, perfluorohexane, perfluoroheptane, perfluorooctane, perfluorobutyl tetrahydrofuran, or methoxy nonafluorobutane.

FIG. 6 shows the relationship between the latent heat and the insulation breakdown voltage of 10 kinds of fluorinated inert liquids.

As described above, the working fluid 10 requires high latent heat and insulation breakdown voltage. In other words, a liquid that is located in a region near the upper-right region in FIG. 6 is preferable for the working fluid 10. Furthermore, when a high cooling effect is required, for example, ethoxynonafluorobutane ($C_4F_9OC_2H_5$), as a hydrofluoroether which is a fluoroether, may be used as the working fluid 10. Furthermore, when a high insulation breakdown voltage is required, for example, perfluorohexane ($C_6F_{14}$), perfluoroheptane ($C_7F_{16}$), or perfluorooctane ($C_8F_{18}$), which are perfluorocarbons, may be used as the working fluid 10. In addition, when latent heat of 115 kJ/kg or higher and an insulation breakdown voltage of 15 kV/mm or higher is required, for example, dodecafluorooctanol ($C_3HF_6$—$CH(CH_3)O$—$C_3HF_6$), as a hydrofluoroether which is a fluoroether, may be used as the working fluid 10. In addition, perfluorotripropylamine ($C_9F_{21}N$) which has an insulation breakdown voltage of 20 kV/mm or higher may be used as the working fluid 10. In this manner, by selecting a liquid having an insulation breakdown voltage of 14 kV/mm or higher and latent heat of 100 kJ/kg or higher, it is possible to provide the semiconductor equipment 100 which has excellent breakdown voltage even when the working fluid 10 is vaporized.

It should be noted that, when voltage is 2000 V or higher, there are cases where electric discharge occurs even when using perfluorohexane, perfluoroheptane, perfluorooctane, perfluorobutyl tetrahydrofuran, or methoxy nonafluorobutane. In this case, the surface of the bonding wire 5 or the semiconductor chip 1 may be insulation-coated with an insulating dielectric film made of aluminum nitride (AlN) or diamond so that electric discharge does not occur at 2000 V or higher even when ethanol, perfluorohexane, perfluoroheptane, perfluorooctane, perfluorobutyl tetrahydrofuran, or methoxy nonafluorobutane vaporize. With such a configuration, a solvent such as ethanol, perfluorohexane, perfluoroheptane, perfluorooctane, perfluorobutyl tetrahydrofuran, or methoxy nonafluorobutane does not penetrate inside the insulating coating film, and electric discharge when a voltage of 2000 V or higher is applied can be suppressed.

Furthermore, in order to satisfy both the high cooling effect and the high insulation breakdown voltage, a material having a high cooling effect and a material having a high insulation breakdown voltage may be mixed as the working fluid 10. An example thereof is described below.

For example, ethanol and a fluorinated inert liquid are used as the materials to be mixed.

Ethanol has a latent heat of 1000 kJ/kg. Ethanol has an extremely high latent heat compared to the aforementioned 10 kinds of fluorinated inert liquids. A high latent heat corresponds to a high cooling effect. Furthermore, the aforementioned 10 kinds of fluorinated inert liquids are given as materials having high insulation breakdown voltage. Therefore, ethanol is used in order to increase the cooling effect and any one of the 10 kinds of fluorinated inert liquids is used in order to increase the insulation breakdown voltage, and they are mixed as the working fluid 10.

Specifically, a mixed solution of and ethanol ($C_2H_6O$) and a liquid such as perfluorooctane ($C_8F_{18}$), perfluorobutyl tetrahydrofuran ($C_8F_{16}O$), methoxy nonafluorobutane ($C_4F_9OCH_3$), ethoxynonafluorobutane ($C_4F_9OC_2H_5$), and dodecafluorooctanol ($C_3HF_6$—$CH(CH_3)O$—$C_3HF_6$), is selected as the working fluid 10.

With this working fluid 10, the cooling effect and breakdown voltage are realized in the following situation. FIG. 7 is a cross-sectional view of the semiconductor equipment 100 for describing the cooling effect and the breakdown voltage of the semiconductor equipment 100. Here, the case where a mixed solution of ethanol and perfluorooctane is used as the working fluid 10 shall be described.

Perfluorooctane dissolves in ethanol at 40° C., and when the temperature of the mixed solution becomes 60° C., ethanol evaporates intensely, the concentration of perfluorooctane in the mixed solution rises, and the working fluid 10 separates into the two phases of ethanol (first phase) and perfluorooctane (second phase). Specifically, as shown in FIG. 7, the working fluid 10 decreases with the evaporation of ethanol, the concentration of perfluorooctane in ethanol increases, and when the limit of solubility is reached, perfluorooctane separates from the mixed solution (working fluid 10) it formed with ethanol. Then, as shown in FIG. 7, a second phase 10a consisting of the separated perfluorooctane tries to form one near-spherical shape such that surface tension energy is minimized, and thus becomes a sphere which covers the surface of the semiconductor chip 1.

Therefore, after the semiconductor chip is driven, ethanol does not yet evaporate while the temperature of the working fluid 10 does not rise to the phase-separation temperature of the working fluid 10, and thus the ethanol is in contact with the semiconductor chip 1 and can transfer the heat of the semiconductor chip 1. Furthermore, when the temperature of the working fluid 10 rises up to the phase-separation temperature of the working fluid 10, due to the heat generated by the semiconductor chip 1, the surface of the semiconductor chip 1 is protected from the ethanol by the perfluorooctane that has separated from the working fluid 10, and thus the electric discharge due to the vaporized ethanol is suppressed and it is possible to provide the semiconductor equipment 100 with excellent breakdown voltage.

FIG. 8A and FIG. 8B show solubility states for the working fluid 10. In FIG. 8A, perfluorooctane is one kind of perfluorocarbon among the fluorinated inert liquids, and perfluorobutyl tetrahydrofuran, ethoxynonafluorobutane, and dodecafluorooctanol are each one kind of fluoroether among the fluorinated inert liquids. FIG. 8A shows the solubility of each of the fluorinated inert liquids and the temperature at which the fluorinated inert liquids phase-separate from the working fluid 10.

In FIG. 8A, "Preservation at 20° C." indicates that the respective mixed working fluids in which ethanol and a fluorinated inert liquid are present are preserved at 20° C. "Stirred at 40° C." indicates that the respective mixed working fluids in which ethanol and a fluorinated inert liquid are present are heated to 40° C., and stirring is performed for a maximum of 30 minutes in a state where the temperature of 40° C. is maintained. It should be noted that when the temperature is 40° C., vaporization during stirring does not occur. Furthermore, "Phase-separation temperature" indicates the temperatures at which the respective fluorinated inert liquids phase-separate from the working fluid 10 when the respective mixed working fluids are heated after the stirring at 40° C.

Hereinafter, specific description shall be carried out using, as an example, a working fluid 10 in which perfluorooctane is dissolved in ethanol.

As shown in FIG. 8A, perfluorooctane does not dissolve in ethanol when preserved at 20° C. but up to 10% dissolves when stirred at 40° C. as shown in FIG. 8B. Here, 10% is the percentage of perfluorooctane with respect to the working fluid 10, and a 10% mixed solution refers to a mixed solution which includes 10% perfluorooctane and 90% ethanol. Since an undissolved portion is created in a mixed solution in which 20% of perfluorooctane is mixed as shown in FIG. 8B, the saturation concentration of perfluorooctane is assumed to be approximately 10%, and thus 10% and thus 10% of perfluorooctane is added and a mixed solution including 10% perfluorooctane and 90% ethanol is adopted as the working fluid 10. Furthermore, when the saturated solubility of perfluorooctane is exceeded at the point past 60° C., the perfluorooctane phase-separates from the working fluid 10 as a liquid phase.

The judgment as to whether or not a liquid is dissolved shall be described here. Ethanol and perfluorooctane have different refractive indices since their specific gravities are different. As a result, although all the liquids are transparent, a border can be identified with the naked eye based on the discontinuity of the background when there is an undissolved portion. Because perfluorooctane exists as a sphere having a flat portion in part of the bottom portion thereof when present in ethanol, the presence of an undissolved portion is verified from the presence of the sphere.

Furthermore, two reasons for using perfluorooctane shall be described. The first reason is that perfluorooctane has a high insulation breakdown voltage. The second reason is that perfluorooctane has a boiling point of 97° C. which is higher than the 78° C. of ethanol.

In the case where the working fluid 10 made of a mixed solution of perfluorooctane and ethanol is used, ethanol vaporizes first when the temperature of such working fluid 10 rises. However, since perfluorooctane has a higher boiling point than ethanol and does not easily evaporate, and the concentration of perfluorooctane in the working fluid 10 rises. Subsequently, when the concentration of the perfluorooctane exceeds the saturated solubility, the perfluorooctane phase-separates in the liquid phase.

It should be noted that in a mixed solution in which 10% perfluorooctane is added in ethanol, it is possible to obtain a latent heat of 1000 kJ/kg, which is the same as that for ethanol, and the insulation breakdown voltage becomes 16.5 V/mm.

Furthermore, a mixed solution of ethanol and perfluorobutyl tetrahydrofuran may be used as the working fluid 10. When the working fluid 10 is produced by mixing perfluorobutyl tetrahydrofuran and ethanol, the blend ratio of perfluorobutyl tetrahydrofuran can be improved to up to approximately 30% at 40° C. as shown in FIG. 8A. Specifically, it is preferable to select, as the working fluid 10, a mixed solution including 30% perfluorobutyl tetrahydrofuran and 70% ethanol. Furthermore, although there is the problem in the case of perfluorooctane that, unless the temperature of the semiconductor chip 1 becomes 78% or higher and the ethanol completely vaporizes, the insulation breakdown voltage becomes less than 16.5 V/mm, an insulation breakdown voltage of 16 V/mm can be obtained even at room temperature in the case of perfluorobutyl tetrahydrofuran. It should be noted that, as shown in FIG. 8B, although an undissolved portion is not created when 30% perfluorobutyl tetrahydrofuran is added, the saturation concentration is set at 30% since an undissolved portion is created when 40% is added.

Furthermore, as shown in FIG. 8A and FIG. 8B, although 5% of ethoxynonafluorobutane dissolves in ethanol at 40° C., solubility is assumed to be 5% since an undissolved portion is left when 10% is added. Phase-separation was verified through heating at 60° C. Furthermore, the dissolving of dodecafluorooctanol in ethanol could not be verified.

With a configuration such as that described above, it is possible to provide the semiconductor equipment 100 having high cooling effect and breakdown voltage, by using, as the working fluid 10, a mixed solution including at least one of ethanol, a perfluorocarbon, and a fluoroether. Furthermore, it is possible to provide the semiconductor equipment 100 having high cooling effect and breakdown voltage, by using, as the working fluid 10, any one of a mixed solution of ethanol and perfluorooctane, a mixed solution of ethanol and perfluorobutyl tetrahydrofuran, and a mixed solution of ethanol and ethoxynonafluorobutane, so as to protect the surface of the semiconductor chip 1 with the second phase 10a consisting of the perfluorooctane, the perfluorobutyl tetrahydrofuran, or the ethoxynonafluorobutane as described above.

It should be noted that, since the GaN or SiC device used as the substrate of the semiconductor chip 1 is more prone to corrosion from water than a Si device, there is the problem that, conventionally, device characteristics deteriorate dramatically when water is used as the working fluid 10. In contrast, in place of water, the above-described semiconductor equipment 100 uses, as the working fluid 10, ethanol, perfluorooctane, perfluorobutyl tetrahydrofuran, or methoxy nonafluorobutane. Therefore, corrosion of GaN, and so on, due to water can be avoided. Furthermore, using any one of a mixed solution of ethanol and perfluorooctane, a mixed solution of ethanol and perfluorobutyl tetrahydrofuran, and a mixed solution of ethanol and ethoxynonafluorobutane to protect the surface of the semiconductor chip 1 with the second phase 10a consisting of the perfluorooctane, perfluorobutyl tetrahydrofuran, or ethoxynonafluorobutane as described above, so that the ethanol, which is more corrosive than perfluorooctane, perfluorobutyl tetrahydrofuran, or ethoxynonafluorobutane does not come into contact with the semiconductor chip 1, has the advantageous effect of further suppressing the corrosion of the GaN, and so on. As shown in FIG. 8B, although it is considered that perfluorooctane, perfluorobutyl tetrahydrofuran, and ethoxynonafluorobutane do not normally dissolve in ethanol, the inventors have found that, at 40° C. or higher, these liquids dissolve in ethanol up to 10%, 30%, and 5%, respectively. As a result, by using any one of a mixed solution of ethanol and perfluorooctane, a mixed solution of ethanol and perfluorobutyl tetrahydrofuran, and a mixed solution of ethanol and ethoxynonafluorobutane, it is possible to suppress the corrosion of the semiconductor chip 1 as described above.

Furthermore, sulfur hexafluoride ($SF_6$) may be used as the working fluid 10. Even when sulfur hexafluoride vaporizes as an electronegative gas, it is known to have a high insulation breakdown voltage of 2000 V. Although sulfur hexafluoride exhibits a high insulation breakdown voltage, the pressure within the heat pipe which uses sulfur hexafluoride becomes 20 atmospheres at 20° C. Therefore, since the pressure within the heat pipe rises dramatically to 50 atmosphere or higher due to the rise in the temperature of the semiconductor chip 1, it is preferable that sulfur hexafluoride be used with consideration being given to the temperature of the semiconductor chip 1.

Embodiment 2

Next, Embodiment 2 of the semiconductor equipment according to the present invention shall be described using FIG. 9 and FIG. 10A to FIG. 10C. FIG. 9 and FIG. 10A to FIG. 10C are cross-sectional views of the semiconductor equipment according to the present embodiment.

A semiconductor equipment 120 according to the present embodiment has the same fundamental configuration as the semiconductor equipment 100 according to Embodiment 1 of the present invention. Therefore, constituent elements in FIG. 9 and FIG. 10A to FIG. 10C which are the same as the constituent elements shown in FIG. 1A are assigned the same numerical references, and detailed explanation thereof shall be omitted or simplified. Furthermore, constituent elements other than those shown in FIG. 9 and FIG. 10A to FIG. 10C are the same as those in Embodiment 1.

The semiconductor equipment 120 according to the present embodiment is different from Embodiment 1 in that a concave recess is formed as a chip placement region of a stem 2a.

Figure 9:
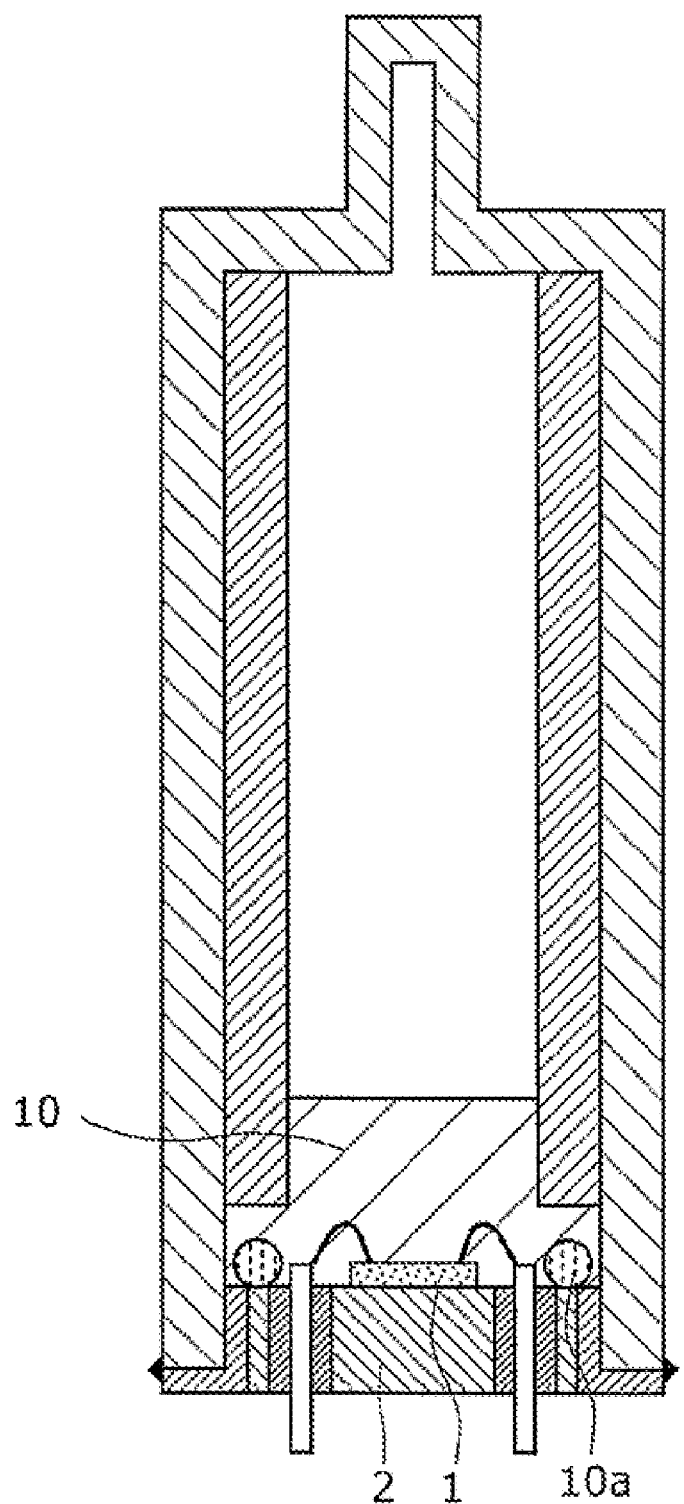
FIG. 9 is a diagram for describing the generation of a second phase in a semiconductor equipment according to Embodiment 2 of the present invention.

First, the specific state of phase separation shall be described using FIG. 9. The semiconductor equipment 100 shown in FIG. 9 uses, as the working fluid 10, a mixed solution of ethanol and perfluorooctane, a mixed solution of ethanol and perfluorobutyl tetrahydrofuran, or a mixed solution of ethanol and ethoxynonafluorobutane.

As described in Embodiment 1, the working fluid 10 shown in FIG. 9 decreases as ethanol evaporates, and the concentration of the solute (perfluorooctane, perfluorobutyl tetrahydrofuran, or ethoxynonafluorobutane) within the ethanol rises. Then, when the concentration of the perfluorooctane, perfluorobutyl tetrahydrofuran, or ethoxynonafluorobutane reaches the limit of solubility, the perfluorooctane, perfluorobutyl tetrahydrofuran, or ethoxynonafluorobutane separates from the first phase consisting of the mixed solution with ethanol, and the second phase 10a consisting of the perfluorooctane, perfluorobutyl tetrahydrofuran, or ethoxynonafluorobutane is created as a spherical form.

Here, when the surface of the semiconductor chip 1 is at a higher position than the surface of the stem 2a, there are cases where the phase 10a created on the surface of the semiconductor chip 1 rolls down the surface of the semiconductor chip 1 and moves to the periphery of the stem 2 of the semiconductor equipment 100, and thus the second phase 10a is not present on the surface of the semiconductor chip 1.

Figure 10A:
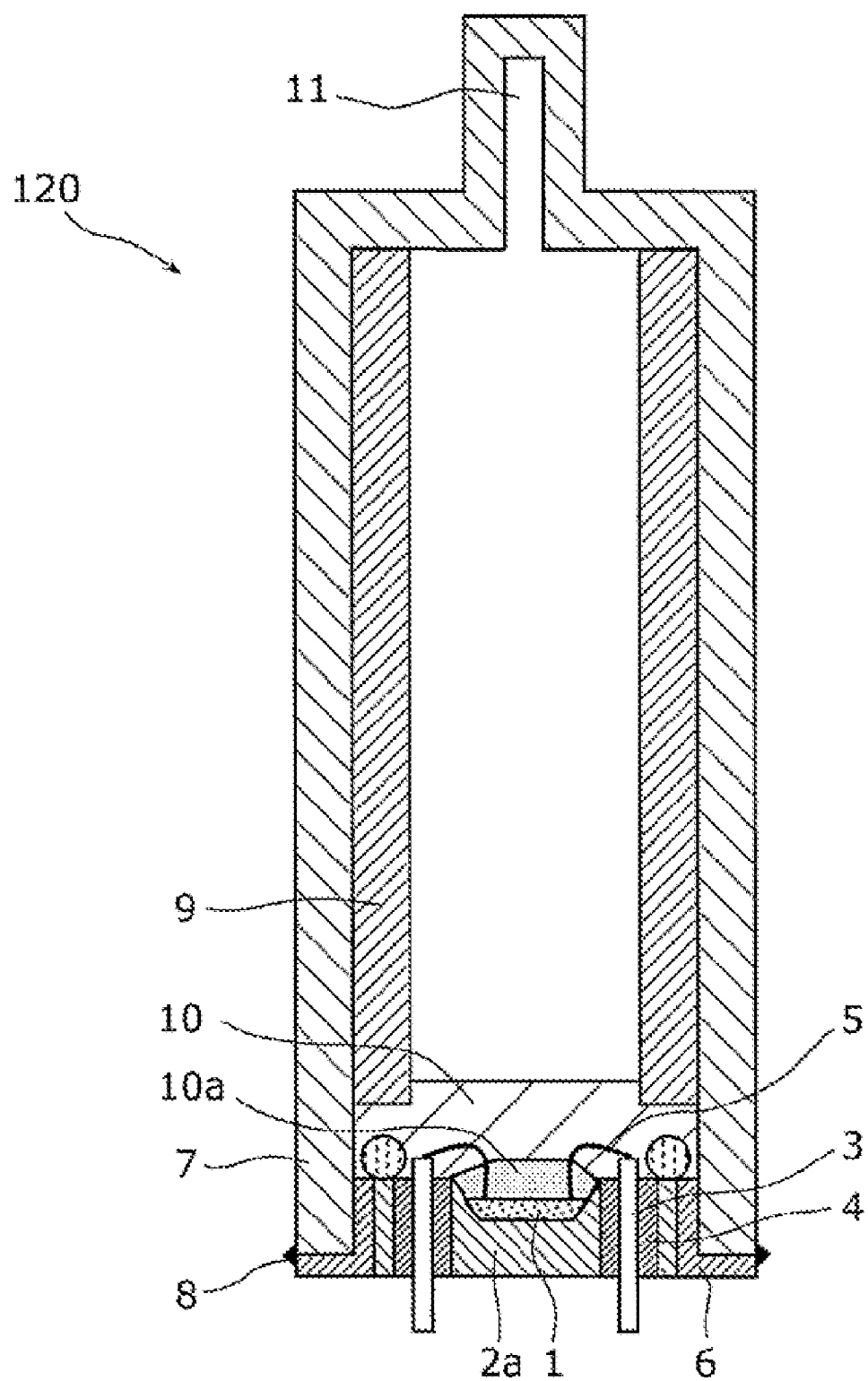
FIG. 10A is a cross-sectional view of the semiconductor equipment according to Embodiment 2 of the present invention.

Here, in the present embodiment, as shown in FIG. 10A, a concave recess is formed in a central portion of the stem 2a, as a chip placement region of the stem 2a of the semiconductor equipment 120. For example, when the semiconductor chip 1 is a square having a size of 5 mm square, a recess having a planar shape that is a square of 6 mm square and a depth of 0.5 mm is formed in the central portion of the stem 2a. The semiconductor chip 1 is mounted inside the recess using silver paste. When the thickness of the semiconductor chip is assumed to be, for example, 0.3 mm, the surface of the semiconductor chip 1 is positioned lower than the surface of the periphery of the stem 2a.

Figure 10B:
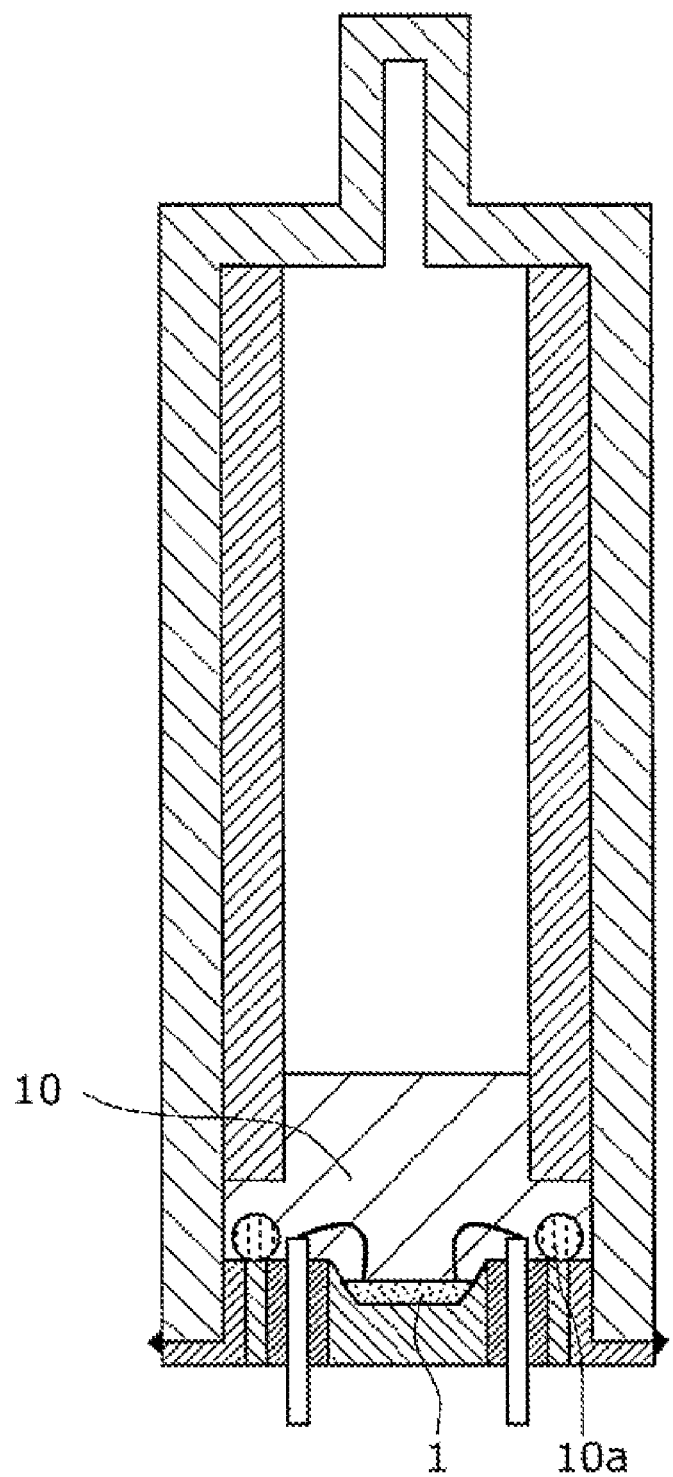
FIG. 10B is a cross-sectional view of the semiconductor equipment according to Embodiment 2 of the present invention.
Figure 10C:
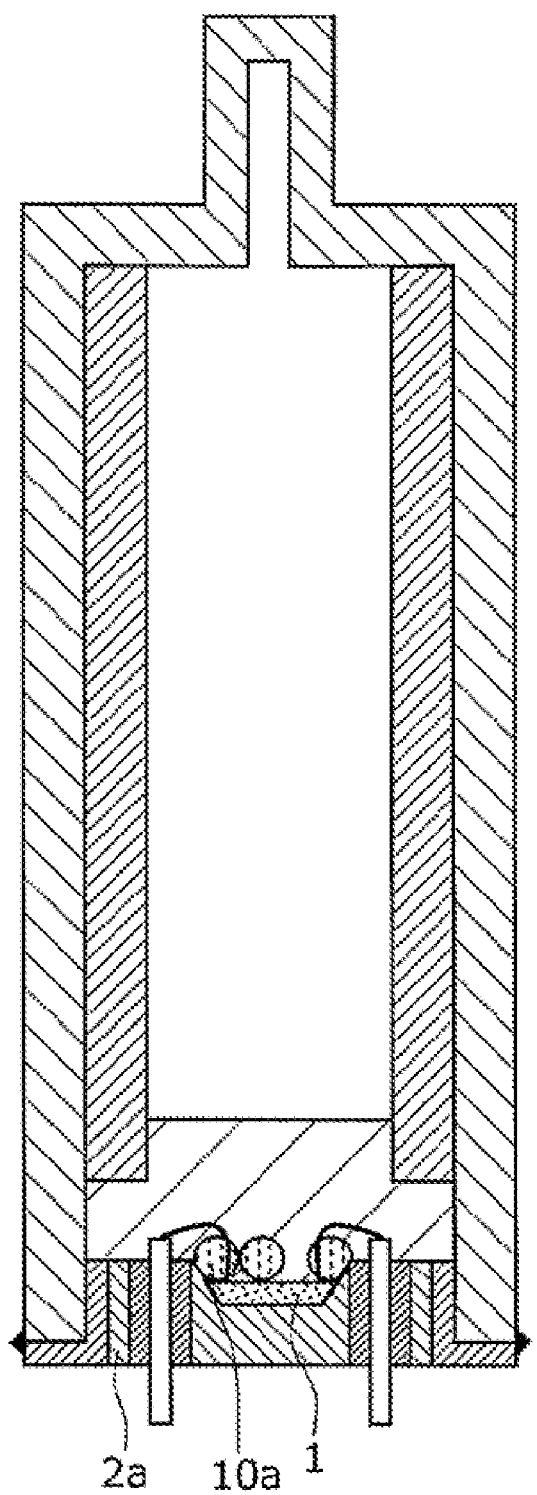
FIG. 10C is cross-sectional view of the semiconductor equipment according to Embodiment 2 of the present invention.

According to this configuration, second phases 10a consisting of the perfluorooctane, perfluorobutyl tetrahydrofuran, or ethoxynonafluorobutane, which are created by separation from the first phase consisting of the mixed solution of ethanol and the solute, following the evaporation of the ethanol, are created as spheres as shown in FIG. 10B. In addition, when the working fluid decreases, the second phases 10a gather on the surface of the semiconductor chip 1 which is relatively lower than the surface of the periphery of the stem 2a, as shown in FIG. 10C. As a result, as shown in FIG. 10A, the second phases 10a which consist of the perfluorooctane, perfluorobutyl tetrahydrofuran, or ethoxynonafluorobutane, attempt to form one near-spherical shape in order to minimize surface tension energy, and eventually combine into one inside the recess. With this, the semiconductor chip 1 is covered with the second phase 10a consisting of the perfluorooctane, perfluorobutyl tetrahydrofuran, or ethoxynonafluorobutane which has a high insulation breakdown voltage, and it is possible to prevent the highly corrosive ethanol from coming into contact with the semiconductor chip 1.

FIG. 10A shows the appearance of the second phases 10a, which consist of the perfluorooctane, perfluorobutyl tetrahydrofuran, or ethoxynonafluorobutane, accumulating on the surface of the semiconductor chip 1. By making the chip placement region concave as in the stem 2a shown in FIG. 10A, it is possible to provide the semiconductor equipment 120 which has a high breakdown voltage.

It should be noted that the planar shape of the concave recess is not limited to a square and may be another polygonal shape or circular shape. Furthermore, the size and depth of the recess may be changed in conformance to the semiconductor chip 1.

Embodiment 3

Figure 11:
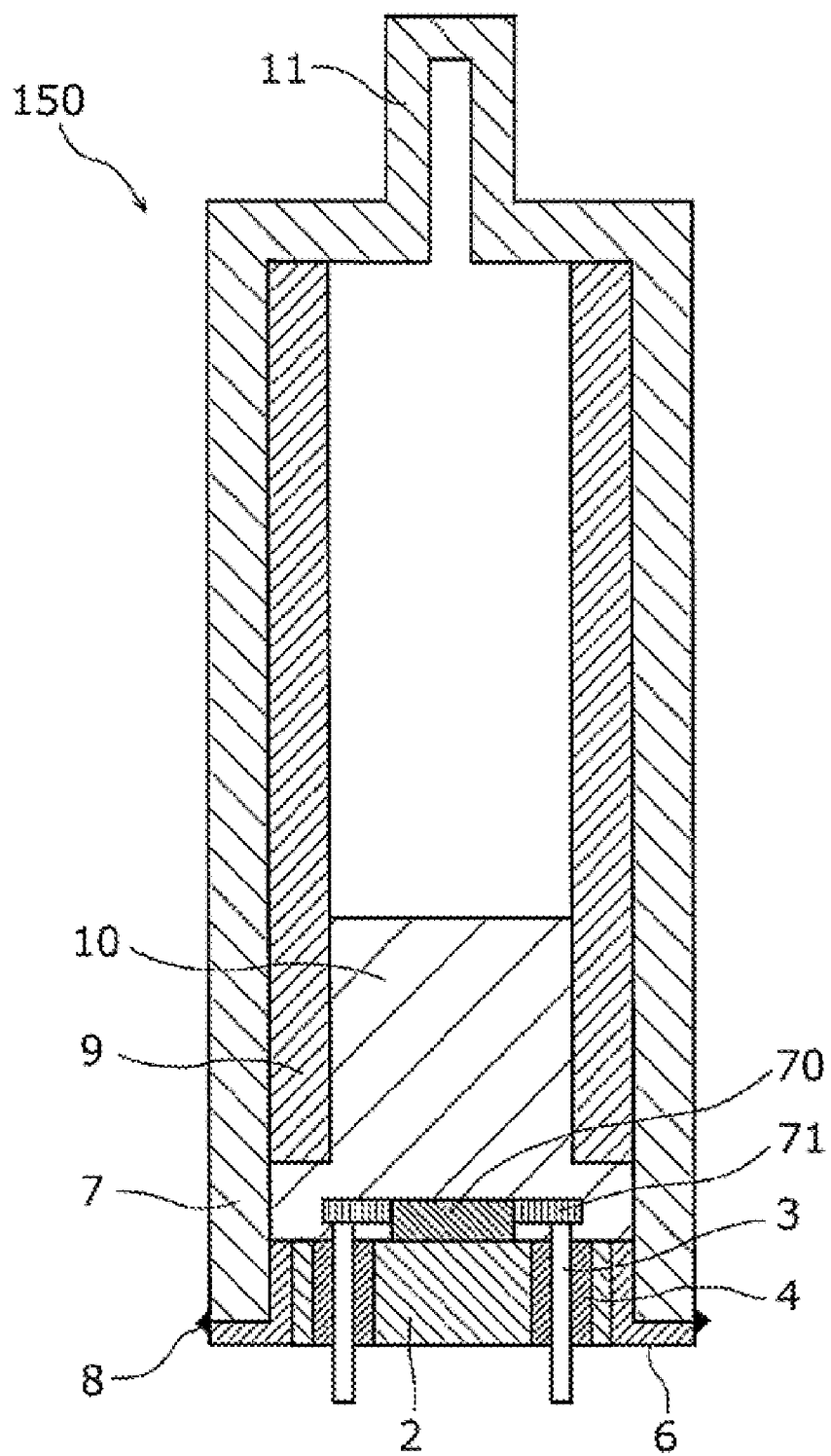
FIG. 11 is a cross-sectional view of a semiconductor equipment according to Embodiment 3 of the present invention.
Figure 12:
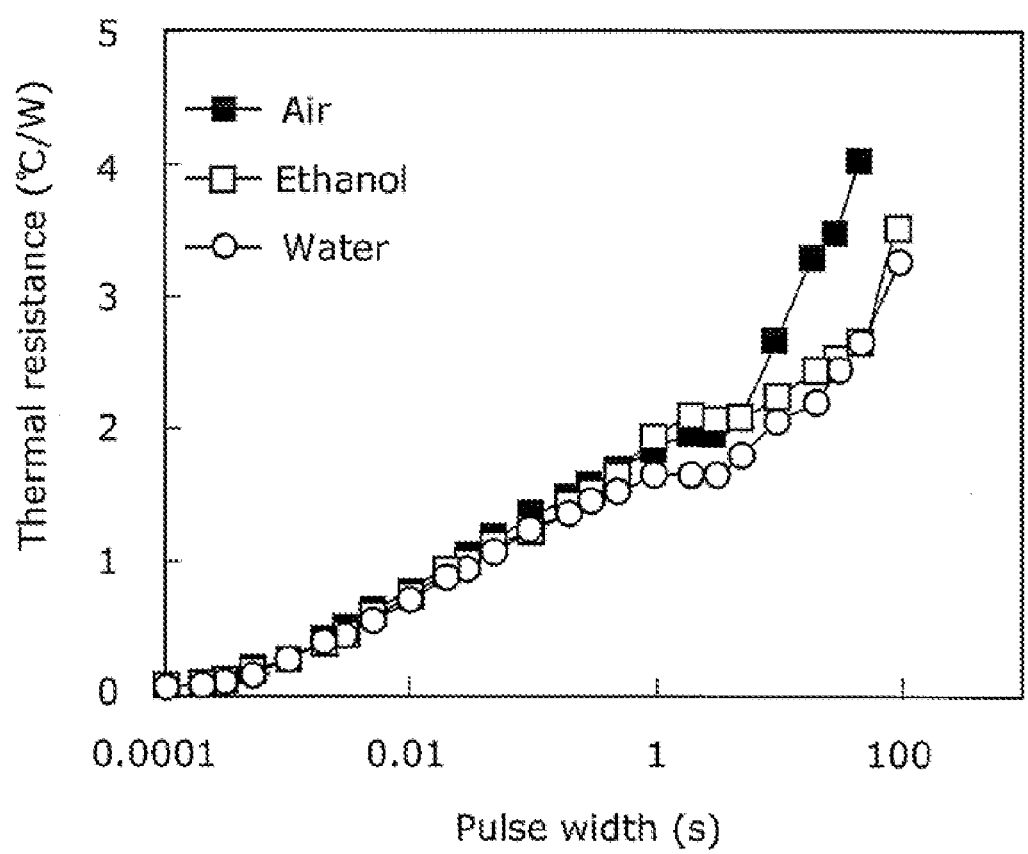
FIG. 12 is a graph showing the relationship between thermal resistance and pulse width, in the semiconductor equipment according to Embodiment 3 of the present invention.

Next, Embodiment 3 of a semiconductor equipment according to the present invention shall be described using to FIG. 11 and FIG. 12. FIG. 11 is a cross-sectional view of a semiconductor equipment according to the present embodiment. FIG. 12 is a graph showing the relationship between thermal resistance and pulse width, in the semiconductor equipment.

A semiconductor equipment 150 according to the present embodiment has the same fundamental configuration as the semiconductor equipment 100 according to Embodiment 1 of the present invention. Therefore, constituent elements in FIG. 11 which are the same as the constituent elements shown in FIG. 1A are assigned the same numerical references, and detailed explanation thereof shall be omitted or simplified. Furthermore, constituent elements other than those shown in FIG. 11 are the same as those in Embodiment 1.

Instead of a configuration in which the semiconductor chip is directly mounted onto the stem, as a semiconductor device, the semiconductor equipment 150 according to the present embodiment has a configuration in which a semiconductor package 70 enclosed in a highly thermal-conductive resin is mounted on the stem 2, as a semiconductor device. In the present embodiment, a TO-220 transistor is used as the semiconductor package 70.

As shown in FIG. 11, the semiconductor package 70 is mounted on the stem 2. Furthermore, package leads 71 of the semiconductor package 70 are bonded to the leads 3 by solder, and so on.

By using the semiconductor package 70 as the semiconductor device instead of a semiconductor chip, it becomes possible to use water as the working fluid. This is because, in the case where the semiconductor device is a semiconductor chip, the GaN used in the substrate, and so on, of the semiconductor chip is corroded by water, whereas, in the case of the semiconductor package 70, the semiconductor chip is covered by resin and thus the semiconductor chip does not come into contact with the water which is the working fluid.

FIG. 12 shows the thermal resistance in the case where ethanol is used as the working fluid 10 and in the case where water is used. The case where ethanol is used as the working fluid 10 is represented by the open squares and the case where water is used is represented using open circles. For comparison, the case where working fluid is not enclosed within the heat pipe (the case where air is enclosed) is represented using closed squares. As shown in FIG. 12, it can be seen that, in the case where the pulse width is 10 seconds or greater, thermal resistance decreases more when ethanol or water is used for the working fluid than when the working fluid 10 is not enclosed.

Furthermore, comparing ethanol and water, either one shows a thermal resistance of 2.0° C. when the pulse width is 1 second. This shows that despite the high 2260 kJ/kg latent heat of water compared to the 1000 kJ/kg latent heat of ethanol, there is not a great change in cooling effect. Specifically, although cooling efficiency increases as latent heat increases in the thermal conduction characteristics of a conventional heat pipe in which a semiconductor chip is not built-in, there is practically no relationship between the magnitude of latent heat and cooling efficiency when there is a heat-generating unit inside the heat pipe as in the present invention. Therefore, it is possible to provide the semiconductor equipment 150 which has excellent cooling effect, even when ethanol is used as the working fluid.

It should be noted that, in the same manner as in Embodiment 1, perfluorohexane, perfluoroheptane, perfluorooctane, perfluorobutyl tetrahydrofuran, or methoxy nonafluorobutane may be used as the working fluid. Furthermore, a mixed solution of ethanol and perfluoroctane, a mixed solution of ethanol and perfluorobutyl tetrahydrofuran, or a mixed solution of ethanol and ethoxynonafluorobutane may be used as the working fluid.

Embodiment 4

Figure 13:
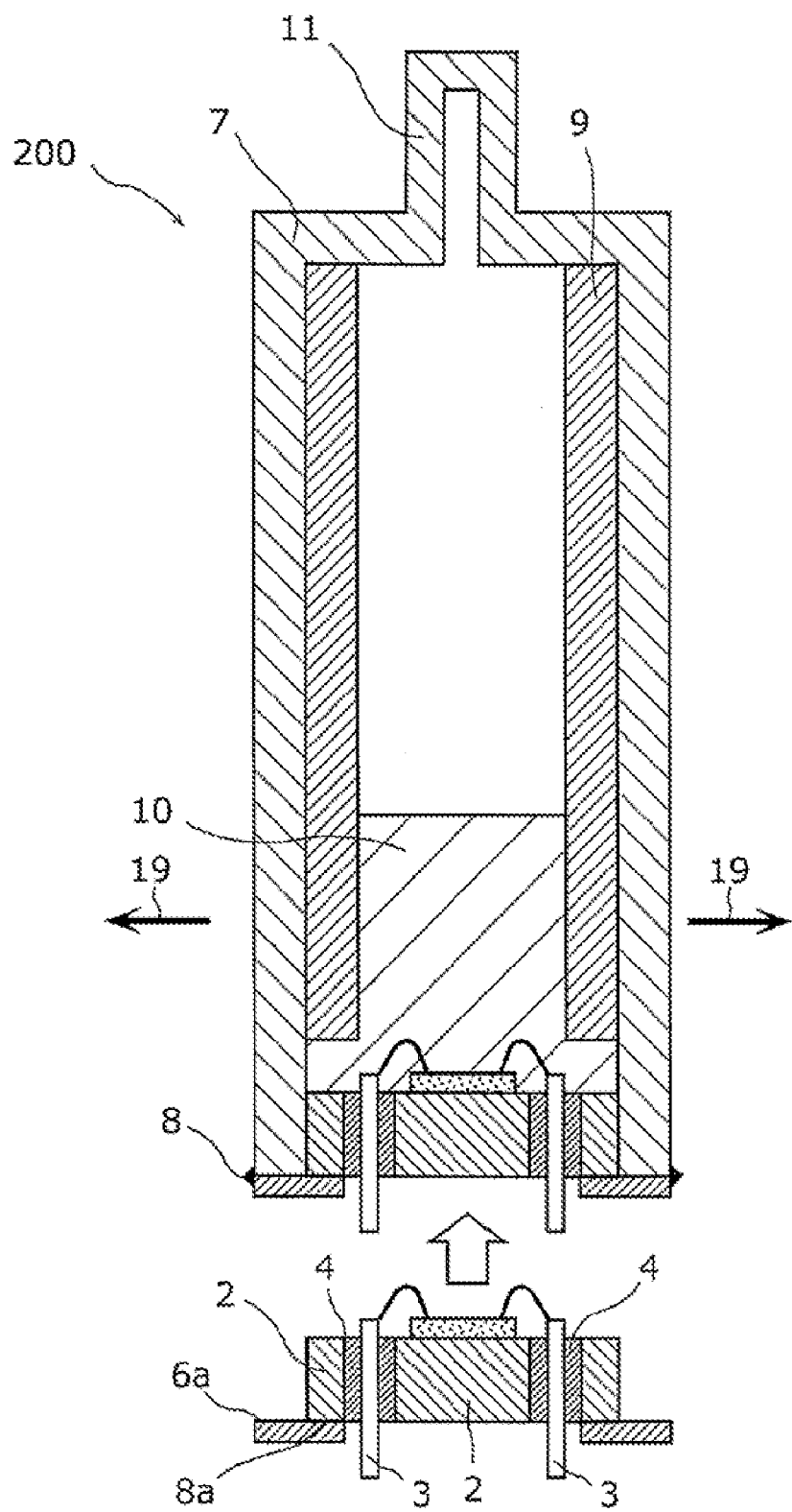
FIG. 13 is a cross-sectional view of a semiconductor equipment according to Embodiment 4 of the present invention.

Next, Embodiment 4 of a semiconductor equipment according to the present invention shall be described using to FIG. 13.

In the semiconductor 100 in Embodiment 1, the stem peripheral portion 6 is brazed to the periphery of the stem 2 and undergoes a cutting process, whereas in a semiconductor equipment 200 in the present embodiment, a stem peripheral portion 6a, which is of a disk shape having a center portion that is hollowed out, is connected to the bottom of the stem 2 by brazing. Hereinafter, the semiconductor equipment 200 in the present embodiment shall be described.

FIG. 13 is a cross-sectional view of the semiconductor equipment 200 according to Embodiment 4 of the present embodiment. Although the stem peripheral portion 6 is brazed to the periphery of the stem 2 in Embodiment 1, it is difficult to perfectly braze the entire periphery of the stem 2 into a cylindrical shape. In view of this, a disk-shaped stem peripheral portion 6a may be brazed to the bottom of the stem 2, instead of the periphery of the stem 2.

In the case of a disk-shaped stem peripheral portion 6a, the brazing portion 8a is of a planar shape. Compared to the cylindrical stem peripheral portion 6 shown in Embodiment 1, brazing is facilitated in the case of the planar stem peripheral portion 6 shown in the present embodiment, and thus there is the advantage that the formation of pinholes is suppressed and the vacuum state can be maintained for a long period. As a result, compared to the leak amount of $10^{-8}$ atm-cc/sec of the semiconductor equipment 100 in Embodiment 1, it is possible to realize a leak amount of $10^{-9}$ atm-cc/sec for the semiconductor equipment 200 in the present embodiment.

Furthermore, with this configuration, the cutting process for forming the stem peripheral portion 6 on the stem 2 becomes unnecessary and thus processing cost can be reduced.

Embodiment 5

Figure 15A:
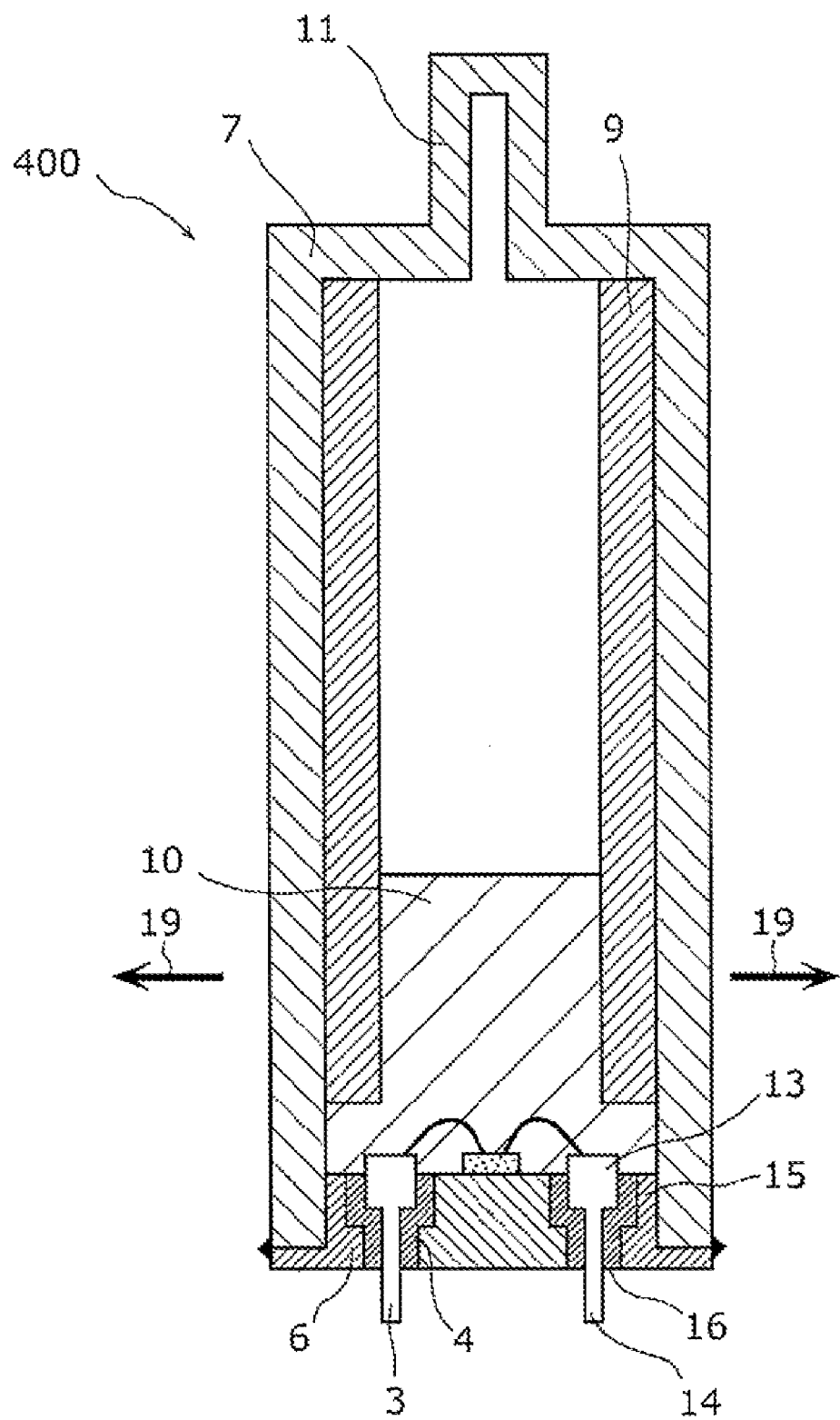
FIG. 15A is a cross-sectional view of the semiconductor equipment according to Embodiment 5 of the present invention.
Figure 15B:
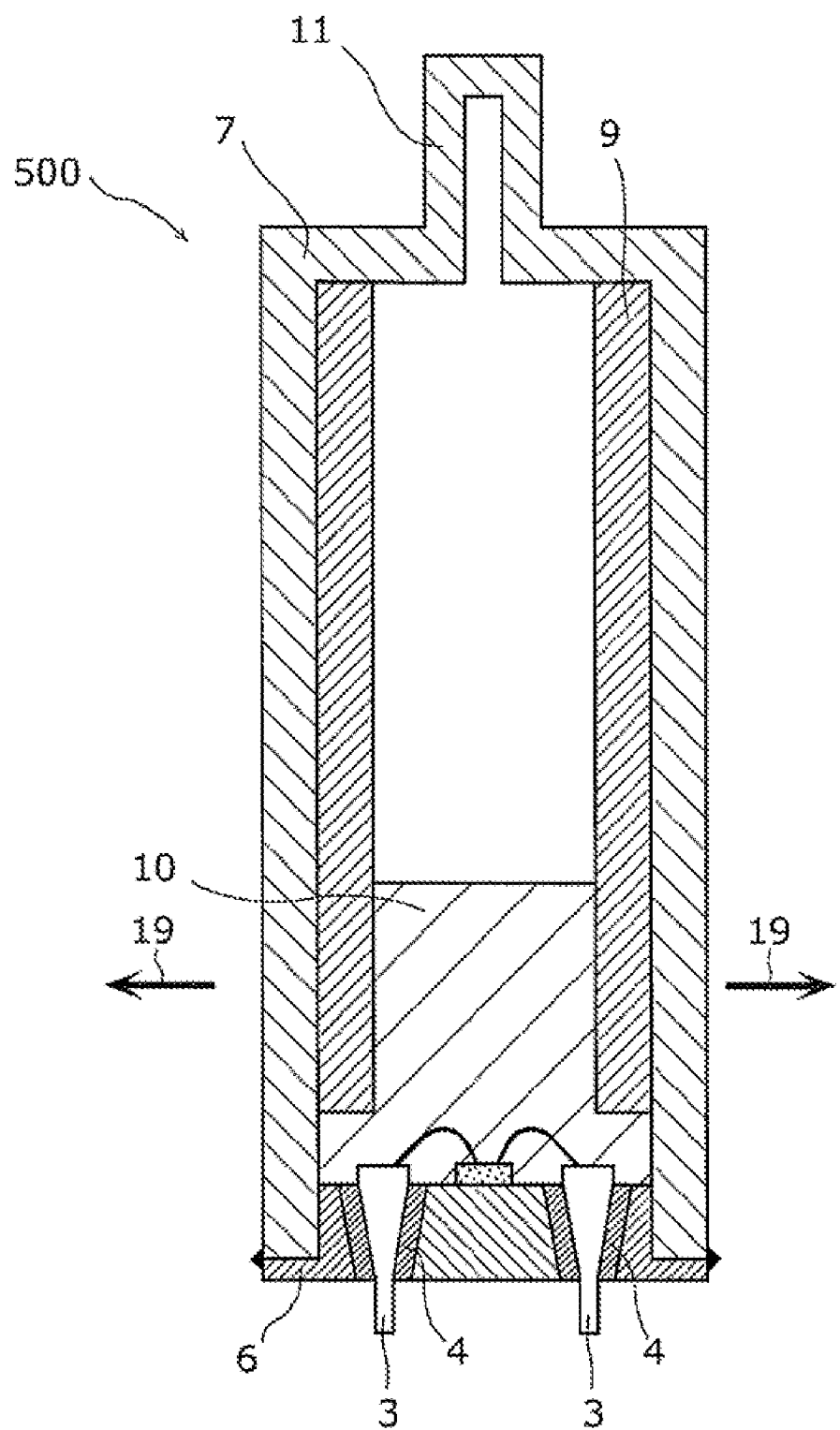
FIG. 15B is a cross-sectional view of the semiconductor equipment according to Embodiment 5 of the present invention.
Figure 16:
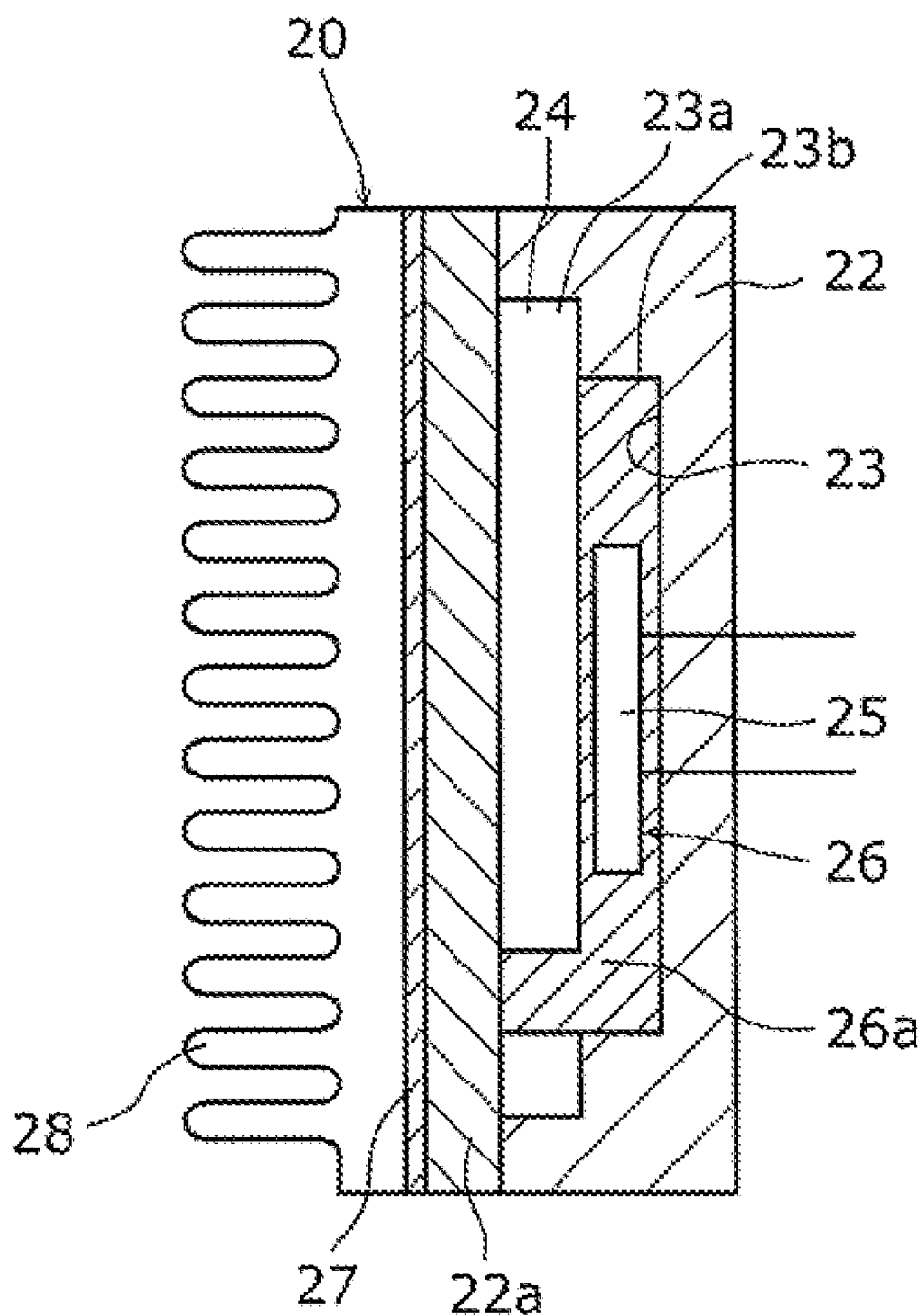
FIG. 16 is cross-sectional view of a conventional semiconductor equipment.
Figure 17:
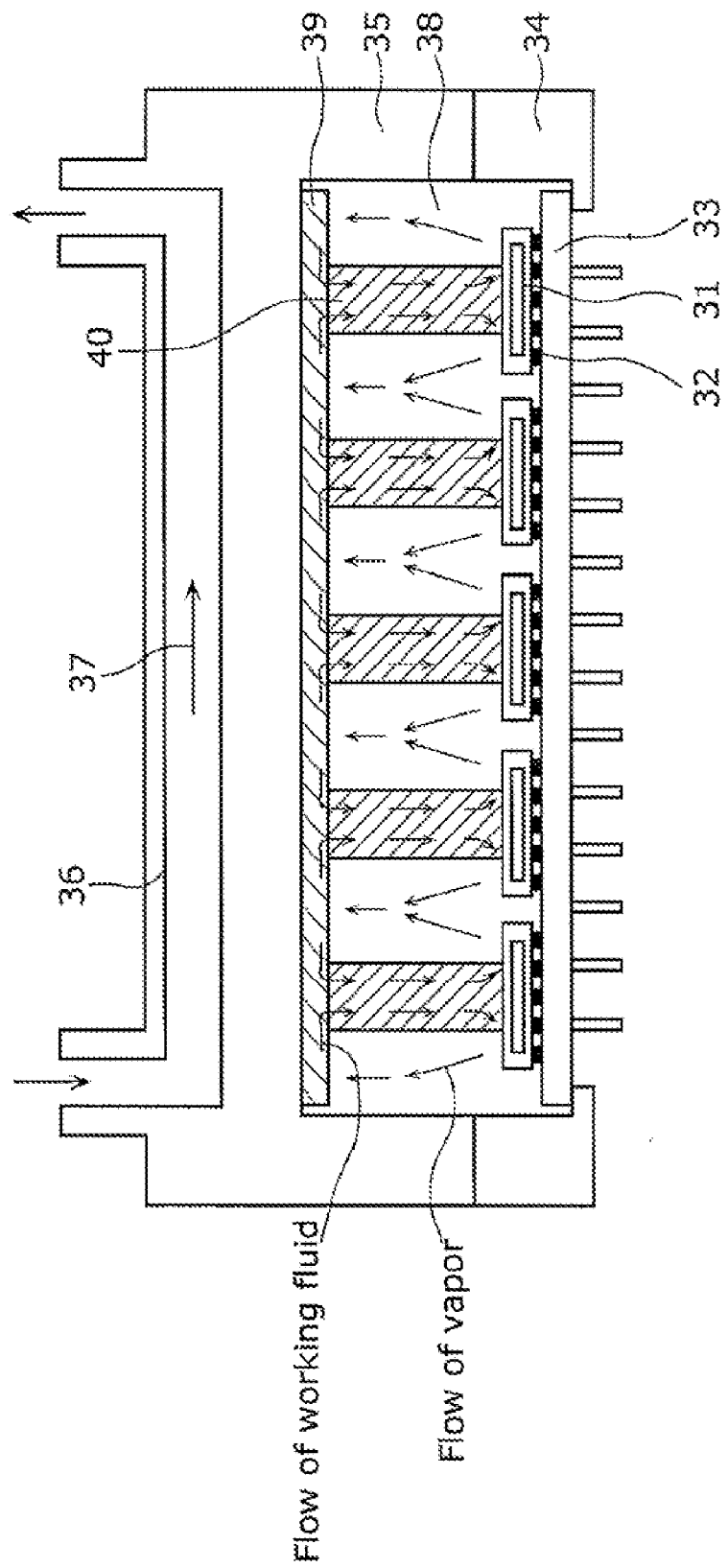
FIG. 17 is cross-sectional view of a conventional semiconductor equipment.
Figure 18:
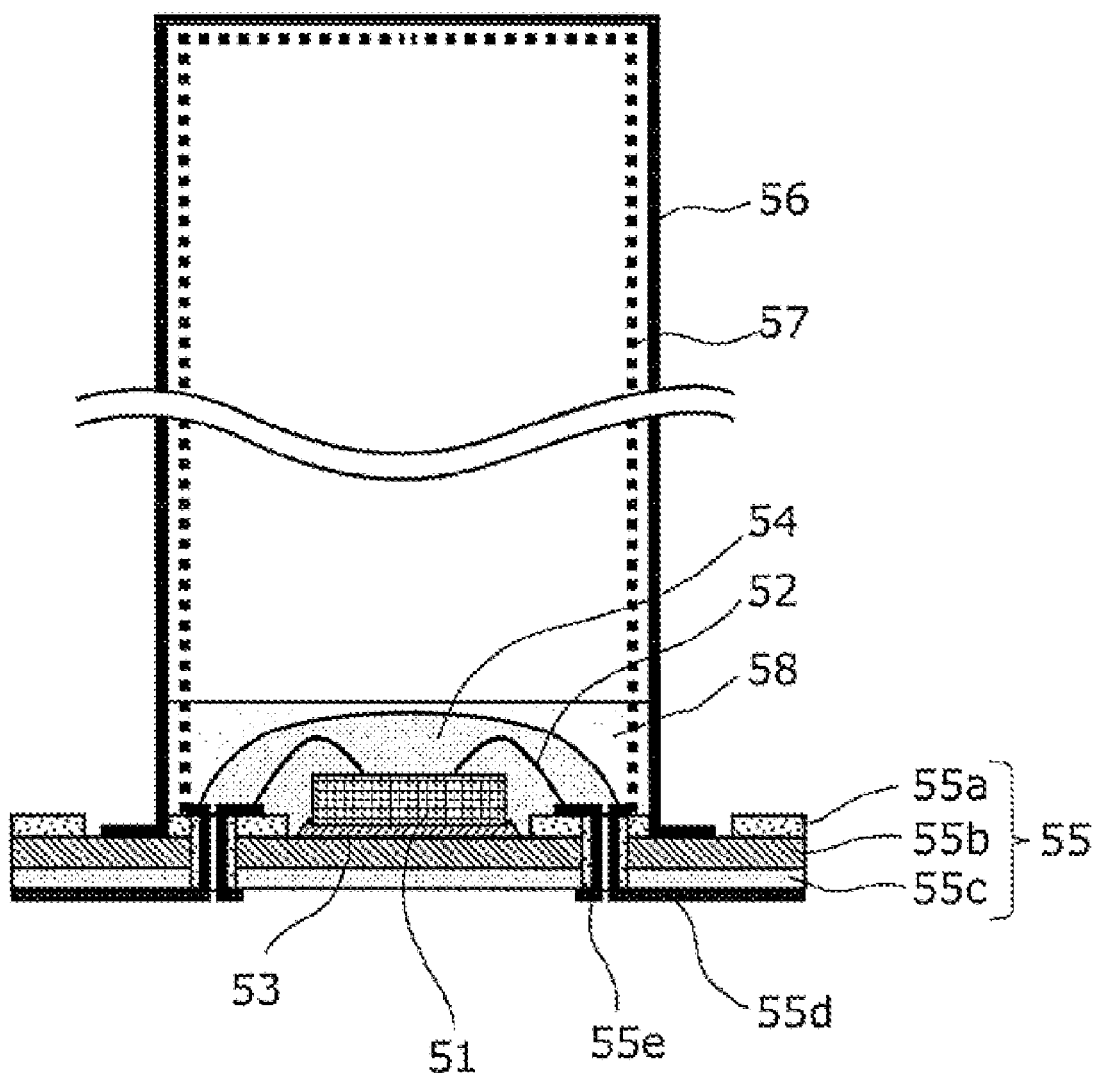
FIG. 18 is cross-sectional view of a conventional semiconductor equipment.
Figure 19:
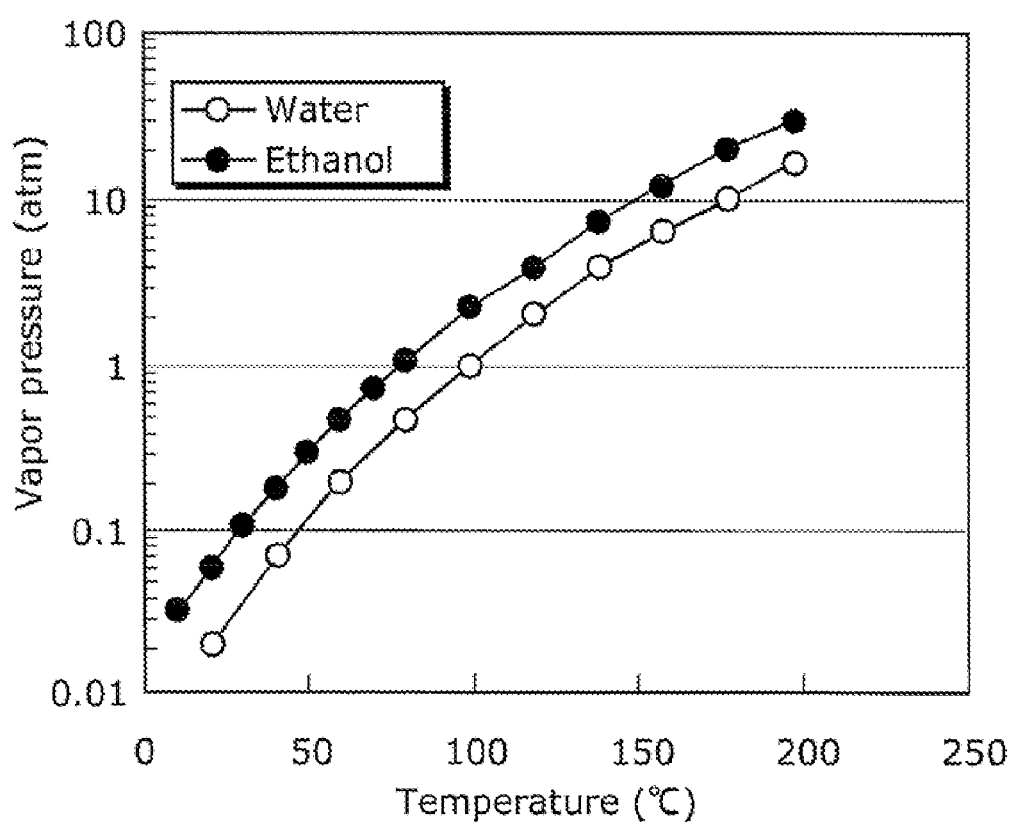
FIG. 19 is a graph showing the relationship between the vapor pressure of the working fluid and temperature, in a conventional semiconductor equipment.

Next, Embodiment 5 of semiconductor equipments according to the present invention shall be described using to FIG. 14, FIG. 15A, and FIG. 15B.

FIG. 14, FIG. 15A, and FIG. 15B are cross-sectional views of semiconductor equipments according to Embodiment 5 of the present invention.

Semiconductor equipments 300, 400, and 500 according to the present embodiment have the same fundamental configuration as the semiconductor equipment 100 according to Embodiment 1 of the present invention. Therefore, constituent elements in FIG. 14, FIG. 15A, and FIG. 15B which are the same as the constituent elements shown in FIG. 1A are assigned the same numerical references, and detailed explanation thereof shall be omitted or simplified. Furthermore, constituent elements other than those shown in FIG. 14, FIG. 15A, and FIG. 15B are the same as those in Embodiment 1.

In the semiconductor equipments 100, 120, 150, and 200 in the previously described embodiments, the pressure inside the heat pipe rises and falls through the repeated rising and falling of the temperature of the semiconductor chip 1 or the semiconductor package 70 according to the operational state. As a result, there is the problem of the deterioration of the bonding strength of the connection between the leads 3 and the stem 2 and the connection between the stem peripheral portion 6 and the sealed container 7. When the sealed container 7 is pressurized, the sealed container 7 expands in a container diametrical direction 19. With this, stress is generated on the welding portion 8 and there are cases where this leads to destruction.

In particular, in the structure of the semiconductor equipment 200 in which the stem peripheral portion 6a is brazed to the bottom of the stem 2 shown in FIG. 13, in Embodiment 3, the impact of deformation due to pressure is concentrated on the brazing portion 8a between the stem 2 and the stem peripheral portion 6a. As a result, aside from the welding portion 8 between the stem peripheral portion 6a and the sealed container 7, the bonding strength of the brazing portion 8a between the stem 2 and the stem peripheral portion 6a also becomes a problem.

In view of this, a structure which suppresses the impact of the repeated changing of pressure, and has high hermetic pressure resistance for the atmospheric pressure inside the sealed container 7 is adopted as in the semiconductor equipment 300 shown in FIG. 14. The semiconductor equipment 300 shown in FIG. 14 has a structure which does not generate stress in the welding portion 8, by forming a trench 17 in the stem peripheral portion 6b, and welding the welding portion 8 between the sealed container 7 and the stem 2 after a tip 18 of the sealed container 7 is inserted inside the trench 17.

Furthermore, the bonding strength of the connection between the leads 3 and ceramic 4 also becomes a problem. In the semiconductor equipments 400 and 500 shown in FIG. 15A and FIG. 15B, respectively, the shape of the lead 3 is such that the diameter of a lead inner-side 13 in the sealed container 7-side is enlarged and the diameter of a lead outer-side 14 is made small. Furthermore, the shape of the lead hole 12 is such that the diameter of a lead hole inner-side 15 on the sealed container 7-side is enlarged and the diameter of a lead hole inner-side 16 on the side outside the sealed container 7 is made small. In other words, each of the leads 3 is formed such that its diameter on the bottom surface-side of the stem 2 becomes smaller than its diameter on the top surface-side of the stem 2 on which the semiconductor chip 1 is placed, and each of the lead holes 12 is formed such that its diameter on the bottom surface-side of the stem 2 becomes smaller than its diameter on the top surface-side of the stem 2.

For example, in the semiconductor equipment 400 shown in FIG. 15A, the size of outer diameter of the leads 3 and the inner diameter of the lead holes 12 change in a stepped manner. Furthermore, in the semiconductor equipment 500 shown in FIG. 15B, the size of outer diameter of the leads 3 and the inner diameter of the lead holes 12 change in a continuous manner.

Although the size of outer diameter of the leads 3 and the inner diameter of the lead holes 12 may be changed in a stepped manner as in FIG. 15 or in a continuous manner as in FIG. 15B, a continuous change is preferable since the stress intensity factor becomes smaller.

It should be noted that although GaN is used as a semiconductor material making up the semiconductor chip 1 which is a power transistor in all of the embodiments, other wide bandgap materials are also acceptable as a semiconductor material making up the semiconductor chip 1 which is a power transistor having a heat generation density that becomes higher. Examples of these are silicon carbide (SiC) and diamond (C).

It should be noted that the present invention is not limited to the above-described embodiments, and various improvements and modifications may be carried out within a scope that does not depart from the essence of the present invention.

For example, although ethanol, perfluorocarbons, and fluoroethers are described as the working fluid in the above-described embodiments, other liquids may be used. Furthermore, although a mixed solution of ethanol and perfluorooctane, a mixed solution of ethanol and perfluorobutyl tetrahydrofuran, or a mixed solution of ethanol and ethoxynonafluorobutane is described as a mixed solution making up the working fluid in the above described embodiments, a mixed solution of ethanol and another fluorinated inert liquid is acceptable.

Furthermore, silver paste may be used as the mounting material of the semiconductor chip. Silver paste is a conductive resin which is softer than solder and capable of suppressing thermal strain caused by temperature deviation, through large elastic deformation. Inside the heat pipe of the semiconductor equipment, the surface of the semiconductor chip is dramatically cooled when the surface of the semiconductor chip is cooled directly by the working fluid, and thus a large temperature deviation is created inside the semiconductor chip and there are cases where the semiconductor chip is destroyed due to thermal strain when the temperature of the semiconductor chip is 150° C. or higher. Although there is concern regarding the seepage of ethanol, a perfluorocarbon, or a fluoroether, into the epoxy resin used in silver paste, it has been confirmed that, with the use of silver paste, problems such as the peeling with prolonged use in high-temperature do not arise, and thus the use of silver paste is advantageous in suppressing destruction of the semiconductor chip due to thermal strain.

Furthermore, although a concave recess is formed in the central portion of the stem of the semiconductor equipment, as a chip placement region of the stem of the semiconductor equipment, the planar shape of the recess is not limited to a square and other polygonal shapes or circular shapes are acceptable. Furthermore the size of the concave recess may be changed in conformance with the semiconductor chip 1.

Furthermore, the stem peripheral portion may be cylindrical, disk-shaped, or may be of another shape.

Furthermore, the material used for brazing is not limited to silver braze or copper braze, and other materials may be used.

Furthermore, the semiconductor chip and the bonding wires may be covered by a passivation film made of, for example, bisphenol A epoxy resin, in the same manner as in the semiconductor equipment shown in the conventional technique.

Furthermore, other embodiments realized by combining arbitrary constituent elements in the above-described embodiments, modifications obtained by various variations performed on the embodiments that are within the scope of the essence of the present invention that may be conceived by those skilled in the art, and various devices including the semiconductor equipment according to the present invention are included in the present invention.

INDUSTRIAL APPLICABILITY

The present invention, as a semiconductor equipment formed from an oxide semiconductor (GaN) or silicon carbide (SiC) or diamond (C) that requires fast heat-transfer, is useful in a device for high-power use that is used in automobiles or electric trains in particular.

What is claimed is:

1. A semiconductor equipment comprising:
a sealed container;
a stem connected to said sealed container via a stem peripheral portion; and
a semiconductor device mounted on a top surface of said stem, inside said sealed container,
wherein said semiconductor device is electrically connected to a lead provided to said stem,
said stem peripheral portion is bonded along a periphery of said stem, said stem peripheral portion being made of a material that is different from a material of said stem and the same as a material of said sealed container,
said stem peripheral portion and said sealed container are connected by welding,
said sealed container is filled with a working fluid which is any one of a mixed solution of ethanol and perfluorooctane, a mixed solution of ethanol and perfluorobutyl tetrahydrofuran, and a mixed solution of ethanol and ethoxynonafluorobutane, and
the top surface of said stem on which said semiconductor device is mounted has a concave shape.

2. The semiconductor equipment according to claim 1, wherein the mixed solution of ethanol and perfluorooctane consists of 90 percent ethanol and 10 percent perfluorooctane.

3. The semiconductor equipment according to claim 1, wherein the mixed solution of ethanol and perfluorobutyl tetrahydrofuran consists of 70 percent ethanol and 30 percent perfluorobutyl tetrahydrofuran.

4. The semiconductor equipment according to claim 1, wherein the mixed solution of ethanol and ethoxynonafluorobutane consists of 95 percent ethanol and 5 percent ethoxynonafluorobutane.

5. A semiconductor equipment comprising:
a sealed container;
a stem connected to said sealed container via a stem peripheral portion; and
a semiconductor device mounted on a top surface of said stem, inside said sealed container,
wherein said semiconductor device is electrically connected to a lead provided to said stem,
said stem peripheral portion is bonded along a periphery of said stem, said stem peripheral portion being made of a material that is different from a material of said stem and the same as a material of said sealed container,
said stem peripheral portion and said sealed container are connected by welding,
said sealed container is filled with a working fluid including at least one of ethanol, a perfluorocarbon, and a fluoroether,
said lead is placed inside a lead hole formed in said stem,
said lead has a smaller diameter at a bottom-side of said stem than at a top-side of said stem, and
said lead hole has a smaller diameter at a bottom-side of said stem than at a top-side of said stem.

6. A semiconductor equipment comprising:
a sealed container;
a stem connected to said sealed container via a stem peripheral portion; and
a semiconductor device mounted on a top surface of said stem, inside said sealed container,
wherein said semiconductor device is electrically connected to a lead provided to said stem,
said stem peripheral portion is bonded along a periphery of said stem, said stem peripheral portion being made of a material that is different from a material of said stem and the same as a material of said sealed container,
said stem peripheral portion and said sealed container are connected by welding,
said sealed container is filled with a working fluid including at least one of ethanol, a perfluorocarbon, and a fluoroether, and
when pressure inside said sealed container is represented by P (MPa) and volume by V ($m^3$), a value of P×V is equal to or less than 0.004.

7. The semiconductor equipment according to claim 1, wherein said stem peripheral portion is connected to a bottom portion of said stem by brazing so as to be coplanar with the bottom portion.

8. The semiconductor equipment according to claim 5, wherein said stem peripheral portion is connected to a bottom portion of said stem by brazing so as to be coplanar with the bottom portion.

9. The semiconductor equipment according to claim 6, wherein said stem peripheral portion is connected to a bottom portion of said stem by brazing so as to be coplanar with the bottom portion.

10. The semiconductor equipment according to claim 1, wherein said semiconductor device is connected to said lead using bonding wire, and
said semiconductor device and the bonding wire are covered with a passivation film.

11. The semiconductor equipment according to claim 5, wherein said semiconductor device is connected to said lead using bonding wire, and
said semiconductor device and the bonding wire are covered with a passivation film.

12. The semiconductor equipment according to claim 6, wherein said semiconductor device is connected to said lead using bonding wire, and
said semiconductor device and the bonding wire are covered with a passivation film.

13. The semiconductor equipment according to claim 1, wherein said semiconductor device is flip-chip mounted on said stem.

14. The semiconductor equipment according to claim 1, wherein said semiconductor device is connected onto said stem using a conductive resin.

15. The semiconductor equipment according to claim 1, wherein said semiconductor device is made of a semiconductor that includes a nitride semiconductor or silicon carbide or diamond.

16. The semiconductor equipment according to claim 1, wherein said semiconductor device includes a hetero semiconductor thin film formed on a sapphire substrate or a silicon substrate.

17. The semiconductor equipment according to claim 1, wherein said semiconductor device includes, in a surface of said semiconductor device, an aluminum nitride film or a polycrystalline diamond film.

18. The semiconductor equipment according to claim 1, wherein said semiconductor device, the bonding wire, and said stem include an insulating dielectric film in a surface of said semiconductor device, the bonding wire, and said stem.

19. The semiconductor equipment according to claim 14, wherein said insulating dielectric film is made of aluminum nitride or diamond.

* * * * *